(12) United States Patent
Kang

(10) Patent No.: US 10,641,442 B2
(45) Date of Patent: May 5, 2020

(54) OPTICAL LENS, AND LIGHT UNIT AND LIGHTING DEVICE HAVING SAME

(71) Applicant: LG INNOTEK CO., LTD., Seoul (KR)

(72) Inventor: Min Soo Kang, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 15/998,939

(22) PCT Filed: Feb. 17, 2017

(86) PCT No.: PCT/KR2017/001784
§ 371 (c)(1),
(2) Date: Aug. 17, 2018

(87) PCT Pub. No.: WO2017/142349
PCT Pub. Date: Aug. 24, 2017

(65) Prior Publication Data
US 2019/0063694 A1 Feb. 28, 2019

(30) Foreign Application Priority Data

Feb. 17, 2016 (KR) .......................... 10-2016-0018337
Sep. 29, 2016 (KR) .......................... 10-2016-0125539

(51) Int. Cl.
*F21K 9/69* (2016.01)
*G02B 3/00* (2006.01)
(Continued)

(52) U.S. Cl.
CPC .................. *F21K 9/69* (2016.08); *F21S 4/26* (2016.01); *F21V 5/045* (2013.01); *F21V 7/0091* (2013.01);
(Continued)

(58) Field of Classification Search
CPC .... F21K 9/69; F21S 4/26; F21V 5/045; F21V 7/0091; F21V 17/005; F21V 7/0008;
(Continued)

(56) References Cited

U.S. PATENT DOCUMENTS

| 2,356,654 A | 8/1944 | Cullman |
| 5,813,743 A | 9/1998 | Naka |

(Continued)

FOREIGN PATENT DOCUMENTS

| JP | 2007-059073 | 3/2007 |
| JP | 2007-311588 | 11/2007 |

(Continued)

OTHER PUBLICATIONS

International Search Report (with English Translation) and Written Opinion dated May 29, 2017 issued in Application No. PCT/KR2017/001784.

*Primary Examiner* — Bao Q Truong
(74) *Attorney, Agent, or Firm* — KED & Associates, LLP

(57) ABSTRACT

An optical lens in embodiment discloses: first and second bottom surfaces spaced apart from each other and having a longer in a second axial direction than to a first axial direction at a lower portion of a transparent body; a concave recess between the first and second bottom surfaces; plurality of incident surfaces having a first incident surface on the recess, second and third incident surfaces corresponding to each other on both sides of the recess; first and second total reflective surfaces disposed on opposite sides of the body; and a first exit surface on the body; and second and third exit surfaces on a both sides the first exit surface.

19 Claims, 25 Drawing Sheets

(51) Int. Cl.
| | |
|---|---|
| *G02B 19/00* | (2006.01) |
| *F21V 17/00* | (2006.01) |
| *H01L 33/58* | (2010.01) |
| *F21V 7/00* | (2006.01) |
| *F21S 4/26* | (2016.01) |
| *F21V 5/04* | (2006.01) |
| *H05K 1/18* | (2006.01) |
| *H01L 33/50* | (2010.01) |
| *F21Y 103/10* | (2016.01) |
| *F21Y 115/10* | (2016.01) |
| *H01L 25/075* | (2006.01) |
| *H01L 33/56* | (2010.01) |

(52) U.S. Cl.
CPC ............. *F21V 17/005* (2013.01); *G02B 3/00* (2013.01); *G02B 19/00* (2013.01); *H01L 33/58* (2013.01); *H05K 1/181* (2013.01); *F21V 7/0008* (2013.01); *F21V 17/002* (2013.01); *F21Y 2103/10* (2016.08); *F21Y 2115/10* (2016.08); *H01L 25/0753* (2013.01); *H01L 33/505* (2013.01); *H01L 33/507* (2013.01); *H01L 33/56* (2013.01); *H05K 2201/10106* (2013.01)

(58) Field of Classification Search
CPC ......... F21V 17/002; G02B 3/00; G02B 19/00; H01L 33/58; H01L 25/0753; H01L 33/505; H01L 33/507; H01L 33/56; H05K 1/181; H05K 2201/10106; F21Y 2103/10; F21Y 2115/10
See application file for complete search history.

(56) References Cited

U.S. PATENT DOCUMENTS

| | | | | |
|---|---|---|---|---|
| 2006/0291245 | A1* | 12/2006 | Shimada | .................... F21V 5/04 362/612 |
| 2008/0198604 | A1* | 8/2008 | Kim | ........................ F21V 5/008 362/293 |
| 2010/0327302 | A1* | 12/2010 | Wang | ...................... F21V 5/008 257/98 |
| 2011/0110098 | A1* | 5/2011 | Fu | ............................ F21V 5/04 362/308 |
| 2012/0051066 | A1 | 3/2012 | Koo et al. | |
| 2013/0070156 | A1 | 3/2013 | Yoo et al. | |
| 2014/0239328 | A1 | 8/2014 | Lee et al. | |
| 2015/0219306 | A1 | 8/2015 | Lee et al. | |

FOREIGN PATENT DOCUMENTS

| | | |
|---|---|---|
| JP | 2010-153138 | 7/2010 |
| JP | 2014-143147 | 8/2014 |
| KR | 20-0435780 | 2/2007 |
| KR | 10-2012-0019000 | 3/2012 |
| KR | 10-1282265 | 7/2013 |
| KR | 10-2014-0105295 | 9/2014 |
| KR | 10-2015-0092429 | 8/2015 |

* cited by examiner (a)

(b)

(a)

(b)

OPTICAL LENS, AND LIGHT UNIT AND LIGHTING DEVICE HAVING SAME

CROSS-REFERENCE TO RELATED PATENT APPLICATIONS

This application is a U.S. National Stage Application under 35 U.S.C. § 371 of PCT Application No. PCT/KR2017/001784, filed Feb. 17, 2017, which claims priority to Korean Patent Application No. 10-2016-0018337, filed Feb. 17, 2016, and Korean Patent Application No. 10-2016-0125539, filed Sep. 29, 2016, whose entire disclosures are hereby incorporated by reference.

TECHNICAL FIELD

The present invention relates to an optical lens.

The present invention relates to a light unit having an optical lens and a lighting device.

BACKGROUND ART

A light emitting device, for example, a light emitting diode (LED), is a type of a semiconductor device which converts electrical energy into light. The light emitting diode replaces an existing phosphor lamp, incandescent lamp, or the like and is considered as a next-generation light source.

Since the light emitting diode generates light by using a semiconductor device, the light emitting diode consumes very low power, as compared to an incandescent lamp which generates light by heating tungsten or a phosphor lamp which generates light by colliding ultraviolet rays generated through high pressure discharge with a phosphor.

Also, since the light emitting diode generates light by using a potential gap of the semiconductor element, the light emitting diode has a long lifespan, a fast response time, and environment-friendly characteristics, as compared to the existing light source.

Accordingly, much research has been conducted to replace the existing light source with a light emitting diode. The light emitting diode is increasingly used as a light source of a lighting apparatus such as various lamps used indoor and outdoor, a display device, an electronic board, a streetlamp, and the like.

DISCLOSURE

Technical Problem

An embodiment provides a new optical lens.

The embodiment provides an optical lens having a long bar shape.

Embodiments provide an optical lens having at least three different incident surfaces and at least three different exit surfaces.

The embodiment provides a light unit including an optical lens having a bar shape on a plurality of light emitting devices.

An embodiment provides a light unit including a plurality of light emitting devices disposed in a recess of an optical lens.

Embodiments provide a light unit capable of allowing light emitted from a top surface and side surfaces of a light emitting device to input an incident surface of an optical lens.

The embodiment provides a light unit including an optical lens having a long length in the length direction of a circuit board on which a light emitting device is disposed.

The embodiment provides a light unit in which each of the plurality of light emitting devices has a plurality of light emitting chips and arranged in the length direction of the optical lens.

The embodiment may provide a light unit capable of reflecting light emitted to both sides of a packaged plurality of light emitting chips by arranging reflective sidewalls on a sidewalls of the plurality of light emitting devices.

The embodiment provides an optical lens including surfaces that transmit light traveling to a lower side of the incident surface of the optical lens and a light unit having the optical lens.

The embodiment provides a light unit in which a plurality of optical lenses are arranged on one circuit board.

The embodiment provides a lighting apparatus including a light unit and a lighting device having an optical lens and a light emitting device.

Technical Solution

An optical lens according to an embodiment comprises: first and second bottom surfaces spaced apart from each other and having a long length in a second axial direction perpendicular to a first axial direction at a lower portion of a transparent body; a concave recess between the first and second bottom surfaces; plurality of incident surfaces having a first incident surface on the recess, a second incident surface and a third incident surface corresponding to each other on both sides of the recess; first total reflective surface and a second total reflective surface disposed on opposite sides of the body; a first exit surface having a long length in the second axial direction on the body and overlapping with the recess in a vertical direction; a second exit surface disposed between the first exit surface and the first total reflective surface; and a third exit surface disposed between the first exit surface and the second total reflective surface, wherein the second and third incident surfaces include a curved surface convex in a direction of the recess, and wherein the first and second total reflective surfaces include a convex curved surface in an outward direction of the body.

Further comprises a light unit or a lighting device having an optical lens according to an embodiment.

According to an embodiment, the first incident surface may include a convex curved surface or a plane.

According to the embodiment, the second and third incident surfaces may include convex curved surfaces.

According to the embodiment, the first exit surface may include a convex surface having a width wider than a width of the first incident surface.

According to an embodiment, the second and third exit surfaces include inclined surfaces having gradually higher height toward the outside from the first exit surface, and a heights of an outer edges of the second and third exit surfaces may be lower than a peak of the first exit surface.

According to an embodiment, a length in the second axial direction of the body is at least four times a length in the first axial direction, and a thickness of the body may be greater than a width in the first axial direction of the body.

According to the embodiment, the first bottom surface overlaps the first exit surface and the second exit surface in the vertical direction, and the first total reflective surface may overlap the second exit surface in the vertical direction.

According to the embodiment, the second bottom surface overlaps the first and third exit surfaces in the vertical direction, and the second total reflective surface may overlap the third exit surface in the vertical direction.

According to the embodiment, a first angle between straight lines connecting the both edges of the first incident surface with respect to the bottom center of the recess is greater than a second angle between straight lines connecting both edges of the first exit surface.

According to an embodiment, further comprising: a first surface between the second incident surface and the first bottom surface, a second surface between the third incident surface and the second bottom surface, a third surface between the first total reflective surface and the first bottom surface; and a fourth surface between the second total reflective surface and the second bottom surface, wherein the first to fourth surfaces have a long length along the second axis direction of the body, and a height of the third and fourth surfaces may be higher than a height of the first and second surfaces.

According to the embodiment, the third surface and the fourth surface may include a vertical plane.

According to an embodiment, the first and second surfaces may include at least one of a vertical plane, a concave curved surface, and a sloped surface.

According to the embodiment, the first surface and the second surface are spaced apart from each other and have a wider interval away from the first and second bottom surfaces.

According to the embodiment, the heights of the third and fourth surfaces may have a range of 1.1 to 1.2 times the height of the first and second surfaces.

A light unit or a lighting device comprises an optical lens according to an embodiment. According to the embodiment, the light unit comprises: a light emitting device in which a plurality of light emitting devices are disposed in a recess of the optical lens; and a circuit board under the light emitting device.

Advantageous Effects

The embodiment may reduce noise such as hot spot caused by light emitted from the optical lens.

The embodiment may improve the light uniformity in the light unit.

The embodiment may improve the incidence efficiency of the optical lens by the light emitting device having the reflective sidewalls.

The embodiment may improve a uniformity of light on the side view type light unit.

The embodiment may improve the reliability of a light unit having an optical lens and a lighting apparatus having the same.

The embodiment may reduce a problem of an interference light due to a tilting of the optical lens.

The embodiment allows a light traveling to a lower portion of the optical lens to be transmitted, and may prevent an interference of the different light to the exit surface.

The embodiment may reduce noise such as hot spot caused by light emitted from the optical lens.

The embodiment may improve a light uniformity in the light unit.

The embodiment may improve an incidence efficiency of the optical lens by the light emitting device having a reflective sidewalls.

The embodiment may improve a uniformity of light in the side view type light unit.

The embodiment may improve the reliability of a light unit having an optical lens and a lighting apparatus having the same.

BEST MODE FOR CARRYING OUT THE INVENTION

Hereinafter, exemplary embodiments will be described in detail with reference to the accompanying drawings. In the description of the embodiments, it will be understood that, when a layer (film), a region, a pattern or a structure is referred to as being "on" or "under" another layer (film), another region, another pattern or another structure, it can be "directly" or "indirectly" on the other layer (film), region, pattern, or structure, or one or more intervening layers may also be present. Such a position of the layer has been described with reference to the drawings.

Hereinafter, an optical lens, a light unit and a lighting unit having the same according to embodiments will be described with reference to the accompanying drawings.

First Embodiment

Figure 1:
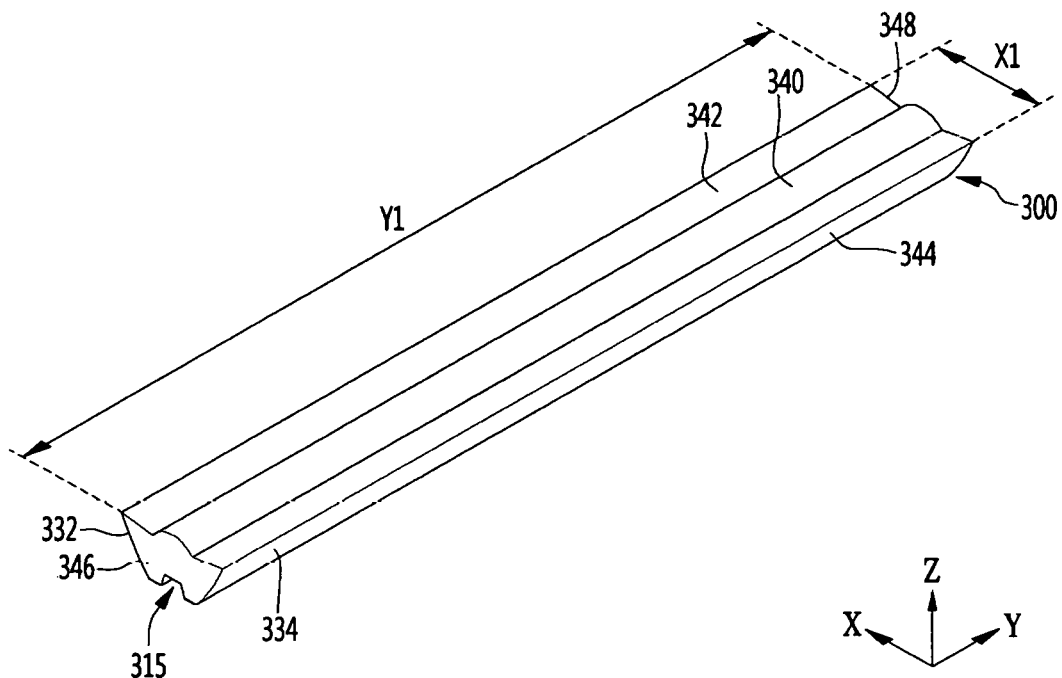
FIG. 1 is a perspective view showing an optical lens according to a first embodiment.
Figure 2:
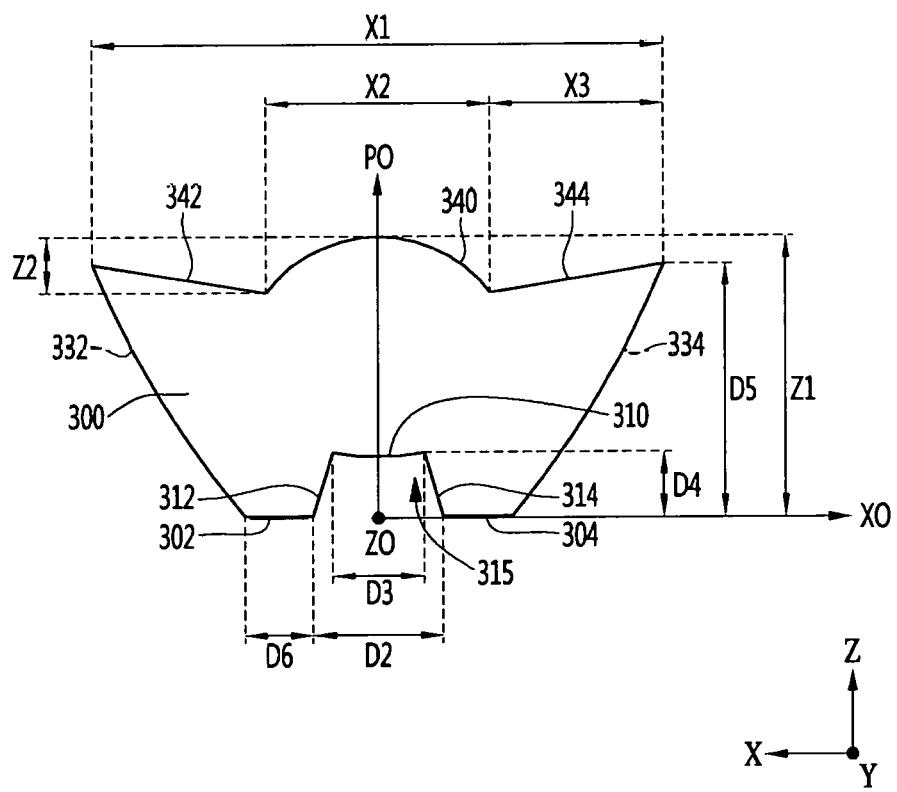
FIG. 2 is a side cross-sectional view of the optical lens of FIG. 1.
Figure 3:
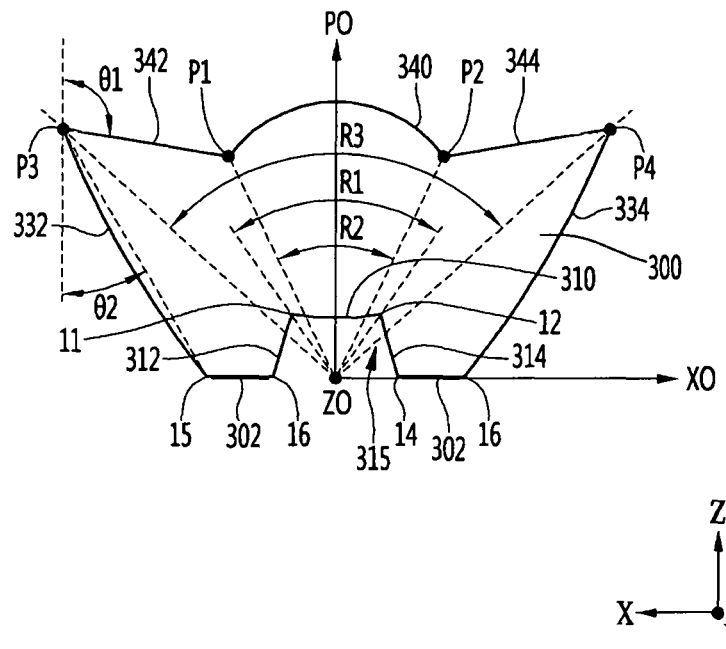
FIG. 3 is a side cross-sectional view for explaining an incident surface and an exit surface with reference to a bottom center of the recess of the optical lens of FIG. 1.
Figure 4:
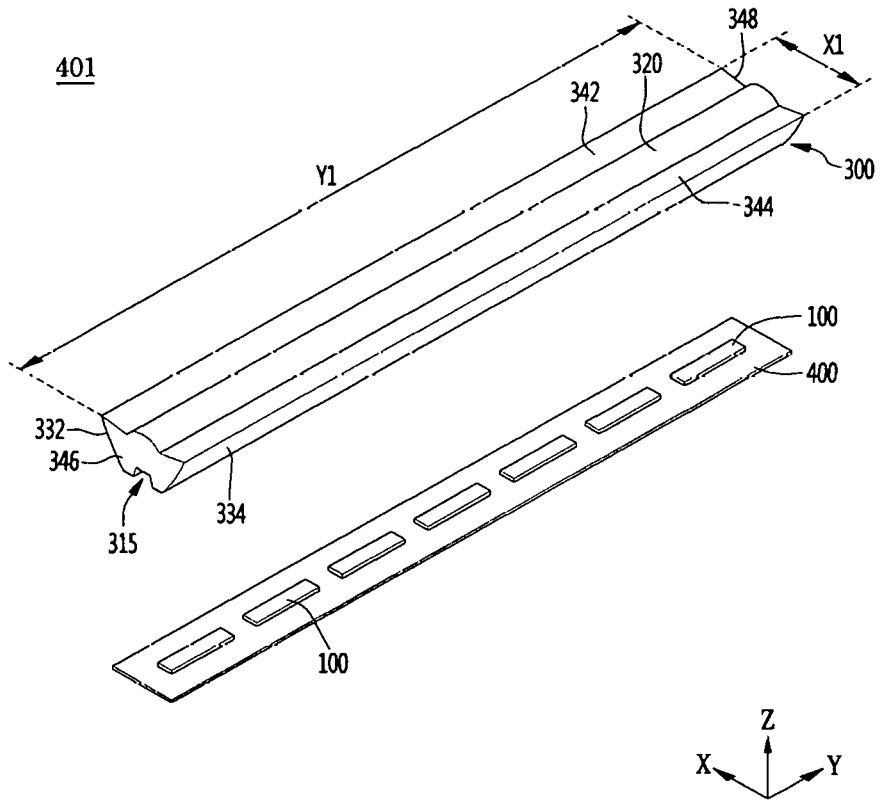
FIG. 4 is a perspective view showing a light unit having the optical lens of FIG. 1.

FIG. 1 is a perspective view showing the optical lens according to the first embodiment, FIG. 2 is a side sectional view of the optical lens of FIG. 1, and FIG. 3 is a plan view of the optical lens shown in FIG. 1, and FIG. 4 is a perspective view showing a light unit having the optical lens of FIG. 1.

Referring to FIGS. 1 to 4, the optical lens 300 according to the embodiment is a transparent body and may have a long length in one direction. In the optical lens 300, a length direction may be a second axis Y direction of the body, a width direction may be a first axis X direction of the body, and a thickness or vertical direction may be a third axis Z direction of the body. The first axis X direction and the second axis Y direction are orthogonal to each other and the third axis Z direction may be orthogonal to the first and second axes X and Y directions.

The length Y1 of the optical lens 300 in the second axis Y direction may be greater than the width X1 of the first axis X direction. The length Y1 of the optical lens 300 may be set to be three times or more, for example, four times or more, or in a range of four times to six times the width X1. If the length Y1 of the optical lens 300 exceeds the above range, the optical lens 300 may be bent. If the length is smaller than the above range, a number of optical lenses 300 may be increased. The length Y1 of the optical lens 300 may range from 60 mm or more, for example, in a range of 65 mm to 75 mm. A thickness Z1 of the optical lens 300 may be the maximum distance between the bottom surface and the exit surface. The width X1 of the optical lens 300 may be a maximum distance in the X-axis direction.

The thickness Z1 of the optical lens 300 according to the embodiment may be set to be smaller than the width X1 of the optical lens 300 and 1/2.5 or less of the width X1 of the optical lens 300, for example, in a range of 1/2.5 to 1/1.8. If the thickness Z1 of the optical lens 300 is smaller than the above range, the light extraction efficiency may be lowered. If the thickness Z1 is greater than the above range, the light efficiency may be lowered. The optical lens 300 according to the embodiment may reduce the number of lenses and improve the brightness and uniformity of the illuminated light.

The optical lens 300 may have a bar shape, and the bar shape may have a straight shape having an elongated length in the Y-axis direction. As another example, the optical lens may be a curved bar shape or a hemispherical bar shape, but is not limited thereto.

Referring to FIGS. 2 and 3, the optical lens 300 includes a plurality of bottom surfaces 302 and 304 having a long length in the first axial direction, a recess recessed between the plurality of bottom surfaces 302 and 304, a plurality of total reflective surfaces 332 and 334 disposed on an outside of the second and third incident surfaces 312 and 314 of the plurality of incident surfaces 310, 312 and 314 which is disposed on the recess 315, and a plurality of exit surfaces 340, 342 and 344 disposed on the plurality of incident surfaces 310, 312 and 314 and the total reflective surfaces 332 and 334.

The plurality of bottom surfaces 302 and 304 may be disposed in different regions at the bottom of the body and may include, for example, a first bottom surface 302 and a second bottom surface 304. The incident surfaces 310, 312 and 314 are disposed in different regions of the recess 315 and may include, for example, a first incident surface 310, a second incident surface 312 and a third incident surface 314. The total reflective surfaces 332 and 334 may include a first total reflective surface 332 and a second total reflective surface 334 disposed on opposite sides of the body. The exit surfaces 340, 342, and 344 may be disposed in different regions on the upper surface of the body and may include a first exit surface 340, a second exit surface 342 and a third exit surface 344.

In the optical lens 300, the plurality of bottom surfaces 302 and 304 may be the bottom surface of the body. The first and second bottom surfaces 302 and 304 may be disposed on both sides of the recess 315. The first bottom surface 302 and the second bottom surface 304 may be separated or spaced from each other. The first bottom surface 302 may be overlapped with the first exit surface 340 and the second exit surface 342 in the vertical direction Z. The first bottom surface 302 has a long length in the Y-axis direction and may support a part of the bottom of the body. The first bottom surface 302 may not overlap the first total reflective surface 332 in the vertical direction. The first bottom surface 302 may be disposed closer to the recess 315 than the first total reflective surface 332. The first bottom surface 302 may be disposed between the recess 315 and the first total reflective surface 332.

The second bottom surface 304 may be disposed to overlap the first exit surface 340 and the third exit surface 344 in the vertical direction. The second bottom surface 304 has a long length in the Y-axis direction and may support a part of the bottom of the body. The second bottom surface 304 may not overlap the second total reflective surface 334 in the vertical direction. The second bottom surface 304 may be disposed closer to the recess 315 than the second total reflective surface 334. The second bottom surface 304 may be disposed closer to the recess 315 than the second total reflective surface 334. The second bottom surface 304 may be disposed between the recess 315 and the second total reflective surface 334.

The first and second bottom surfaces 302 and 304 are long in the length direction and may be disposed parallel to each other at the bottom center ZO of the recess 315. The width X3 of each of the first and second bottom surfaces 302 and 304 may be 2 mm or less, for example, in a range of 1.5 mm and 2 mm. The width X3 of the first and second bottom surfaces 302 and 304 is a width on a straight line X0 that is horizontal to the bottom center ZO of the recess 315. If the width is narrower than the above range, the strength may be lowered, and if the width is greater than the above range, there is a problem that the width X1 of the optical lens 300 becomes too large.

Here, the first bottom surface 302 overlaps an inner region of the second exit surface 342 in the vertical direction, and the second bottom surface 304 overlaps an inner region of the third exit surface 344 in the vertical direction. The first total reflective surface 332 overlaps with an outer region of the second exit surface 342 in the vertical direction, and the second total reflective surface 334 may overlap an outer region of the third exit surface 344.

The first and second bottom surfaces 302 and 304 may be flat surfaces. The first and second bottom surfaces 302 and 304 may be irregular surfaces or support protrusions may protrude as described below. The bottom surfaces 302 and 304 according to the embodiment may be further extended by a bottom portion extending outward in the X-axis direction as described later, but the present invention is not limited thereto.

The recess 315 may be recessed between the first and second bottom surfaces 302 and 304 in the light emitting direction. The recess 315 may be recessed from the first and second bottom surfaces 302 and 304 toward the first exit surface 340 or the center of the body. A length of the recess 315 may be long in the second axial direction, i.e., the length direction. The length of the recess 315 may be the same as the length Y1 of the optical lens 300. The length of the recess 315 may be smaller than the length Y1 of the optical lens 300. In this case, another incident surface or another total reflective surface may be further disposed outside the optical lens 300 in the longitudinal direction. The recess 315 may have a structure in which a bottom direction (or downward direction) of the optical lens 300 and a direction of a second axis Y are open.

The recess 315 may be disposed at a predetermined depth D4 from the bottom center ZO and a predetermined width. The recess 315 may have a shape in which the upper width D3 is narrower than the bottom width D2. The recess 315 may have a shape in which the width gradually decreases as the depth is deepened. The depth D4 of the recess 315 may be a minimum distance between the bottom center and the first incident surface 310 and may be less than 0.5 of the thickness Z1 of the optical lens 300 or a thickness of the body.

A difference between the upper width D3 and the bottom width D2 in the recess 315 may have a difference of 0.8 mm or more, for example, in the range of 0.8 mm to 1.2 mm. If the difference between the upper width D3 of the recess 315 and the bottom width D2 is greater or smaller than the above range, the light incident distribution may be changed. The bottom width D2 of the recess 315 may be in the range of 3 mm or more, for example, in a range of 3 mm to 4 mm, and the upper width D3 of the recess 315 may be in the range of 2 mm to 2.8 mm. The bottom width D2 of the recess 315 may be wider than the width of the light emitting device described later. The upper width D3 of the recess 315 may be wider than the width of the light emitting device described later. Since the recess 315 is arranged long in the length direction, a plurality of light emitting devices may be disposed inside the recess 315, thereby maximizing the light incidence efficiency.

The plurality of incident surfaces 310, 312 and 314 may be disposed on the upper surface and both lateral surfaces of the recess 315 as a surface of the recess 315. The plurality of incident surfaces 310, 312 and 314 includes a first incident surface 310 which is an upper surface of the recess 315 and second and third incident surfaces 312 and 314 which are both lateral surfaces of the recess 315. The first incident surface 310 may be a curved surface, for example, a curved surface that protrudes toward the bottom of the recess 315. The first incident surface 310 may include a convex surface having a predetermined radius of curvature. Since the first incident surface 310 is provided as a curved surface convex downward, the incident light may be refracted to advance to the first exit surface 340. The first incident surface 310 may be disposed between the second incident surface 312 and the third incident surface 314.

The second incident surface 312 may be disposed between the first incident surface 310 and the first bottom surface 302. The third incident surface 314 may be disposed between the first incident surface 310 and the second bottom surface 304. The second incident surface 312 may have a convex curved surface in the direction of the recess 315 or a flat inclined surface. The third incident surface 314 may be a convex curved surface in the direction of the recess 315 or a flat inclined surface.

The plurality of exit surfaces 340, 342 and 344 are disposed on the body. The plurality of exit surfaces 340, 342 and 344 are convex first exit surfaces 340 on a center region of the body, and second and third exit surfaces 340 and 342 inclined to both sides of the first exit surface 340. The plurality of exit surfaces 340, 342 and 3444 may include a first exit surface 340 for refracting incident light to the first incident surface 310 and emitting light, a second exit surface 342 for reflecting light incident through the second incident surface 312 and emitting light, and a third exit surface 344 for refracting the light incident through the third incident surface 314 and emitting the light. The first exit surface 310 may overlap the first incident surface 310, the second and third incident surfaces 312 and 314 in the vertical direction.

The plurality of total reflective surfaces 332 and 334 are both lateral surfaces of the body and are disposed on both laterals in the length direction of the optical lens 300 to change the path of the incident light from the side direction to the emission direction. The plurality of total reflective surfaces 332 and 334 include first and second total reflective surfaces 332 and 334 and the first total reflective surface 332 is disposed between the first bottom surface 302 and the second exit surface 342, and the second total reflective surface 334 is disposed between the second bottom surface 304 and the third exit surface 344.

The first total reflective surface 332 may have an outwardly convex curved surface. The first total reflective surface 332 reflects the light incident on the second incident surface 312 toward the second exit surface 342. The second total reflective surface 334 may have an outwardly convex curved surface. The second total reflective surface 334 reflects the light incident on the third incident surface 314 toward the third exit surface 344. Each of the first and second total reflective surfaces 332 and 334 may be a curved surface having the same curvature radius or a curved surface having different radius of curvature.

Referring to FIG. 2, the first exit surface 340 of the optical lens 300 may be disposed in the center region and may include a convex surface in the direction of the center axis Y0 or upward. The first exit surface 340 may have a convex curved surface in a direction opposite to the protruding direction of the curved surface of the first incident surface 310. The first exit surface 340 may have a curved surface having a curvature radius smaller than the curvature radius of the first incident surface 310. The width X2 of the first exit surface 340 may be a lower width and a maximum distance that connects both edges of the first exit surface 340 in a straight line. Each edge of the first exit surface 340 may be a boundary point with the second and third exit surfaces 342 and 344. The width X2 of the first exit surface 340 may be in a range of two times or more, for example, in a range of two times to three times the width D3 of the first incident surface 310. When the width X2 of the first exit surface 340 is smaller than the above range, the amount of light incident on the first exit surface 340 through the first incident surface 310 is reduced, when the width X2 of the first exit surface 340 is greater than the above range, the improvement of the exit efficiency is insignificant and the width X3 of the second and third exit surfaces 342 and 344 may be changed.

The width X2 of the first exit surface 340 may be greater than the width X3 of the second and third exit surfaces 342 and 344. The width X2 of the first exit surface 340 may be more than 1 times and not more than 3 times the width X3 of the second and third exit surfaces 342 and 344. A ratio of the width X3 of the second or third exit surface to the width X2 of the first exit surface 340 may be in the range of 1:1.1 to 1:1.5. The width X2 of the first exit surface 340 may be 5 mm or more, for example, in range of 5.5 mm to 6.5 mm and the width X3 of the second and third exit surfaces 342 and 344 may be 5.4 mm or less, for example, in a range of 4 mm to 5.4 mm. If the width X2 of the first exit surface 340 is smaller than the above range, an emission efficiency of the center region may be lowered. If the width X2 is greater than the above range, an emission efficiency of the side region may be lowered. The width X3 of the second and third exit surfaces 342 and 344 may be a straight line connecting both edges of the second or third exit surfaces 342 and 344.

The first through third exit surfaces 340, 342 and 344 may have the same length as the length Y1 of the optical lens 300. Since the first to third exit surfaces 340, 342 and 344 are arranged to have the same length as the recess 315, the first to third exit surfaces 310, 312 and 314 are deflected with respect to the light incident through the first to third incident surfaces 310 and may emits in a emission direction. As another example, the first exit surface 340 may have a length equal to the length Y1 of the optical lens 300, and the second and third exit surfaces 342 and 344 may have a length shorter than the length Y1 of the optical lens 300. The first and second total reflective surfaces 332 and 334 may be disposed on the inclined surfaces of the sidewalls 346 and 348 of the optical lens 300. Both sidewalls 346 and 348 of the optical lens 300 may be formed in a vertical plane or a sloped surface in a region adjacent to the first and second exit surfaces 342 and 344.

As shown in FIG. 2, the first exit surface 340 may have a gradually higher height toward the center from the boundary point P1 and P2 in FIG. 3 between the first exit surface 340 and the second and third exit surfaces 342 and 344. The maximum height Z2 of the first exit surface 340 may have a height of 1 mm or more, for example, in a range of 1.2 mm to 2 mm. The maximum height Z2 of the first exit surface 340 may vary depending on the radius of curvature or the width X2 of the first exit surface 340. Since the first exit surface 340 has the maximum height Z2 and the width X2 and is disposed on the first incident surface 310, the light incident through the first incident surface 310 refracts and emits.

The maximum height or thickness D5 of the second and third exit surfaces 340 may be smaller than the thickness Z1 of the optical lens 300. The outer points, for example, the outer edges P3 and P4 of the second and third exit surfaces 340 may be lower than the peak height of the first exit surface 340. Since the second and third exit surfaces 342 and 344 provide inclined surfaces, the light reflected through the first and second total reflective surfaces 332 and 334 may be refracted.

Referring to FIG. 3, in the optical lens 300, an angle between straight lines passing through both edges 11 and 12 of the first incident surface 310 with respect to the bottom center ZO of the recess 315 may be a first angle R1 and the first angle R1 may have a range of 60 degrees or more, for example, in a range of 60 degrees to 75 degrees. The first angle R1 formed by the both edges 11 and 12 of the first incident surface 310 from the bottom center ZO of the recess 315 may vary depending on the orientation angle of the light emitting device.

The first angle R1 may be greater than the second angle R2. The second angle R2 is an angle between straight lines passing through both edges P1 and P2 of the first exit surface 340 with respect to the bottom center ZO of the recess 315. A difference between the first angle R1 and the second angle R2 may have a difference of 10 degrees or more, for example, in a range of 15 degrees to 25 degrees. If the difference between the first and second angles R1 and R2 is smaller than or greater than the above range, the thickness of the optical lens 300 may be influenced or the optical efficiency may be changed. The extraction efficiency of light emitted to the center region of the optical lens 300 may be improved by the first and second angles R1 and R2.

The angle between straight lines passing through the outer edge P3 of the second exit surface 342 and the outer edge P4 of the third exit surface 344 toward the bottom center ZO of the recess 315 is a third angle R3 and the third angle R3 may have 90 degrees or more, for example, in a range of 90 degrees to 100 degrees. The third angle R3 may divide the ranges of the second and third exit surfaces 342 and 344 and the first and second total reflective surfaces 332 and 334 to improve light extraction efficiency in the side region.

The second and third exit surfaces 342 and 344 may have an angle inclined with respect to a horizontal straight line and may have an angle θ1 of more than 90 degrees, for example, in a range of 95 degrees to 103 degrees with respect to vertical axis P0 or the straight line. The angle θ2 between the first and second total reflective surfaces 332 and 334 and the straight line connecting the both edges P3-15 and P4-16 with respect to the vertical axis is 50 degrees or less, for example, in a range of 25 degrees to 35 degrees. The first and second total reflective surfaces 332 and 334 may have a curved surface protruding outwardly from the straight line connecting both edges P3-15 and P4-16. The straight line connecting the both edges (straight line P3-15 and straight line P4-16) of the first and second total reflective surfaces 332 and 334 provides a plane inclined with respect to the vertical axis so that the second and third incident planes 312 and 314 may be reflected by the second and third exit surfaces 342 and 344.

The optical lens 300 may include a light transmissive material. The optical lens 300 may include at least one of polycarbonate (PC), polymethyl methacrylate (PMMA), silicon or epoxy resin, or glass. The optical lens 300 may include a transparent material having a refractive index of 2 or less, for example, in the range of 1.4 to 1.7.

The second and third incident surfaces 312 and 314, the first and second total reflective surfaces 332 and 334, and the second and third exit surfaces 342 and 344 may be a symmetrical or asymmetrical shape with respect to an axis P0 perpendicular to the bottom center ZO of the recess 315 or the straight line. The left/right symmetrical shape may have a uniform distribution of the light incident on and the light emitted by the left/right symmetrical shape, and the light distribution in any one direction may be increased by the asymmetric shape.

Referring to FIG. 4, the light unit 401 according to the embodiment includes an optical lens 300 and a light emitting module, and the light emitting module may provide light under the optical lens 300. The light emitting module may include a circuit board 400 and a light emitting device 100. In the light emitting module, a plurality of light emitting devices 100 may be disposed on the circuit board 400. The light unit 401 may include the optical lens 300, the circuit board 400, and the light emitting device 100.

The plurality of the light emitting devices 100 may be disposed on the circuit board 400 in the direction of the length Y1 of the optical lens 300. The plurality of light emitting devices 100 may be arranged along the length direction of the optical lens 300 at a predetermined interval. The light emitting devices 100 may be disposed in the recess 315 of the optical lens 300.

The circuit board 400 may connect the plurality of light emitting devices 100 to each other, for example, in series, in parallel, or in series-parallel. The circuit board 400 may include a layer disposed under the optical lens 300 and absorbing or reflecting light leaked from the optical lens 300 on a surface thereof.

Figure 6:
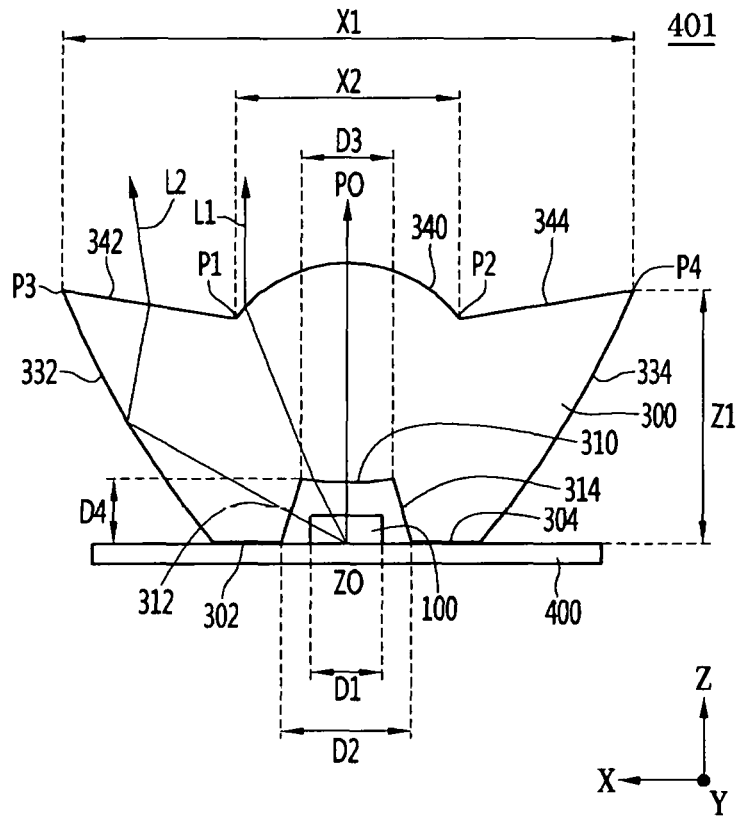
FIG. 6 is a side sectional view of the light unit of FIG. 1.

Referring to FIG. 6, the width of the circuit board 400 in the X-axis direction may be wider than the bottom width D2 of the recess 315, and may be 5 mm or more. The circuit board 400 may be in contact with the first and second bottom surfaces 302 and 304 of the optical lens 300.

Figure 5:
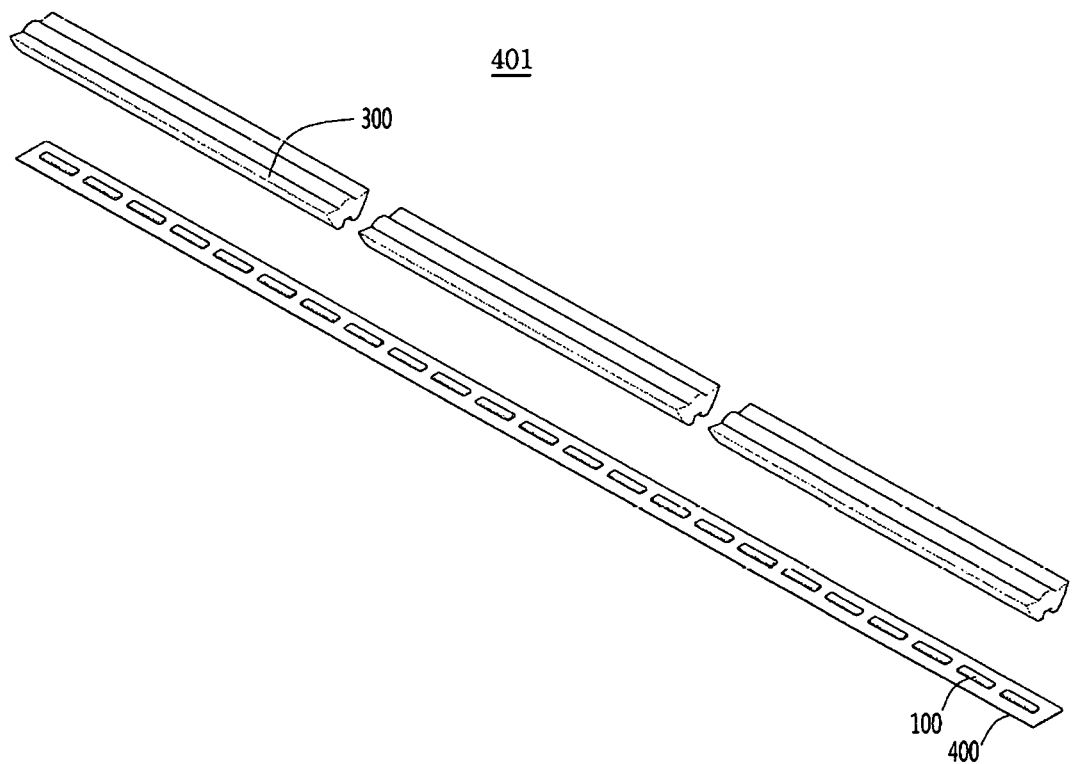
FIG. 5 is a perspective view showing another example of the light unit having the optical lens of FIG. 1.

The length of the circuit board 400 is a length in the Y-axis direction and is longer than the length (Y1 in FIG. 1) of the optical lens 300 to absorb or reflect the light leaked from the optical lens 300. One or a plurality of optical lenses 300 may be disposed on the circuit board 400. For example, as shown in FIG. 5, a plurality of optical lenses 300 may be arranged in a length direction on one circuit board 400. Since the length of the optical lens 300 (Y1 in FIG. 1) may be bent when molded to the length of 80 mm or more, the plurality of optical lenses 300 may be disposed on one circuit board 400.

The circuit board 400 may include at least one of a resin-based PCB, a metal core PCB (MCPCB) having a metal core, and a flexible PCB (FPCB), but the invention is not limited thereto. The light emitting device 100 may emit at least one or more than two of white, blue, green, red, yellow, and ultraviolet light, but the invention is not limited thereto.

The light emitting device 100 may be disposed within the recess 315 of the optical lens 300. The light emitting device 100 may be disposed adjacent to the first incident surface 310, the second and third incident surfaces 312 and 314 of the recess 315. The lower surface of the light emitting device 100 may be disposed higher than the bottom surfaces 302 and 304 of the optical lens 300. The lower surface of the light emitting device 100 may be disposed higher than the upper surface of the circuit board 400. In the embodiment, when the light emitting device emits light through at least three surfaces, for example, five surfaces, the light emitted from the light emitting device 100 may be incident on the first, second and third incident surfaces 310, 312 and 314 of the optical lens 300. Accordingly, loss due to light emitted from the light emitting device 100 may be reduced.

Referring to FIG. 6, the first exit surface 340 of the optical lens 300 emits the first light L1 incident on the first incident surface 310 within a range of 0±45 degrees with respect to the center axis Y0. The first exit surface 340 may refract the first light L1 so that the first exit surface 340 does not deviate from the first exit surface 340.

The second and third exit surfaces 342 and 344 of the optical lens 300 emits in a range of +45 to +90 degrees and −45 to −90 degrees with respect to an axis perpendicular to the second light L2 incident on the second and third incident surfaces 312 and 314. The second and third exit surfaces 342 and 344 may refract the emitted second light L2 so as not to deviate from the second and third exit surfaces 342 and 344.

Figure 42:
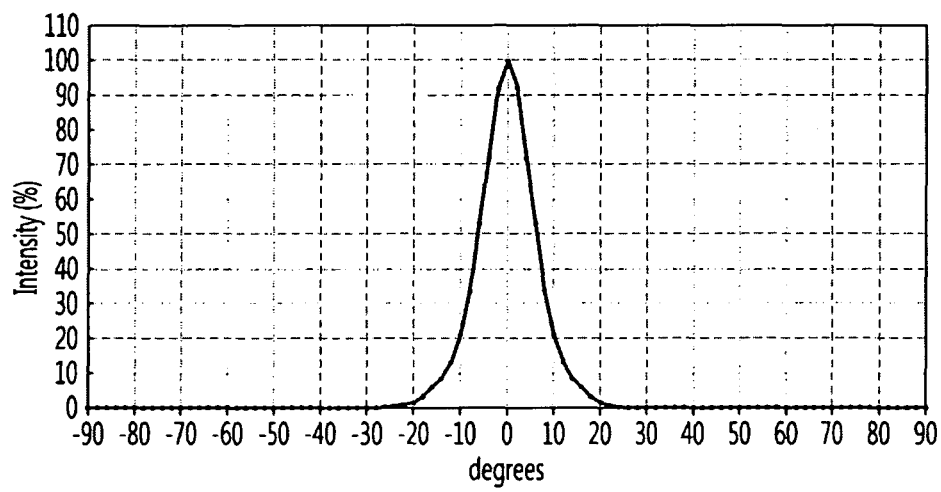
FIGS. 42(a) and 42(b) are diagrams showing the beam angle distributions of the optical lens according to the embodiment.
Figure 42:
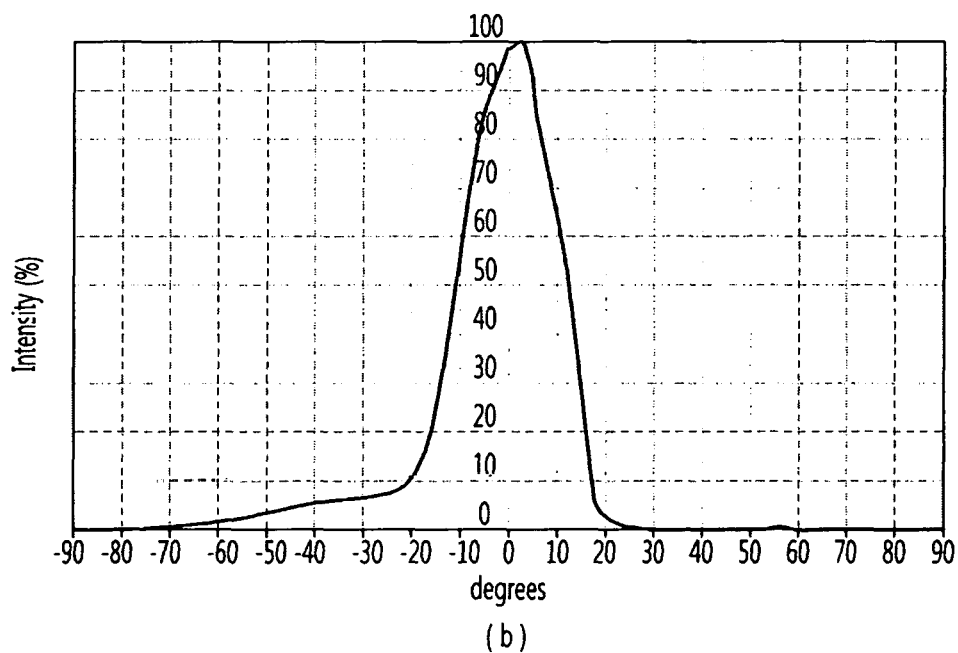

The beam angle distribution of the light emitted from the optical lens 300 according to the embodiment may be found in a range of 20 degrees or less, for example, in arrange of 13 degrees to 20 degrees, with respect to the central axis as shown in FIG. 42(a).

Referring to FIGS. 7 to 12, a light emitting device according to an embodiment will be described. The light emitting device described below may be applied to the first embodiment, or may be applied to the second and third embodiments.

Figure 7:
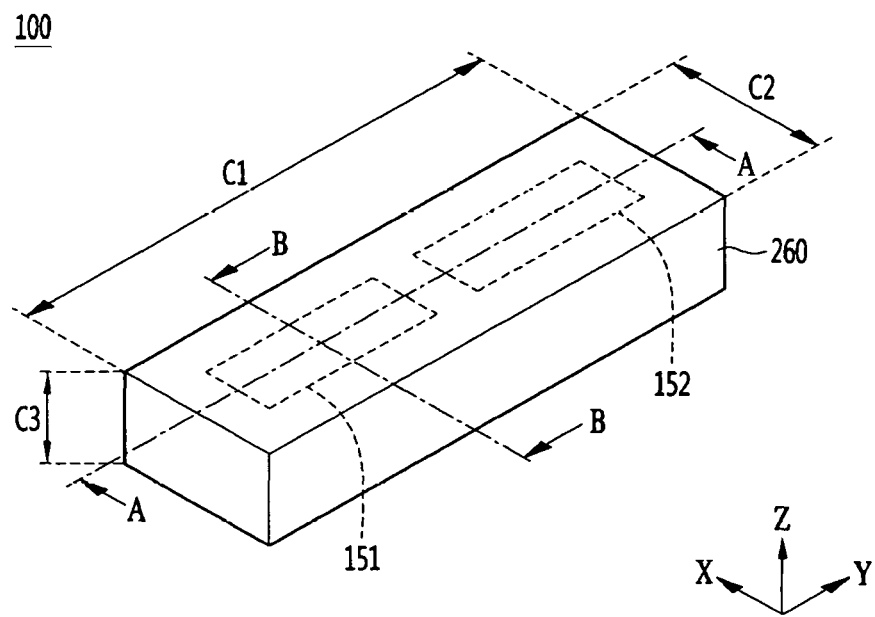
FIG. 7 is a perspective view showing a light emitting device of the light unit according to the embodiment.

Referring to FIG. 7, the light emitting device 100 includes a device having a length C1 longer than a width C2. For example, the length C1 may be twice or more the width C2. The width C2 of the light emitting device 100 may be 500 μm or more, for example, 600 μm or more, the length C1 may be 1000 μm or more, for example, 1200 μm or more and the thickness C3 may be 200 μm or more. The width direction of the light emitting device 100 may be the width direction of the optical lens or the X-axis direction, the length direction may be the length direction of the optical lens or the Y-axis direction, and the thickness direction may be the thickness direction of the optical lens or a vertical direction.

Figure 8:
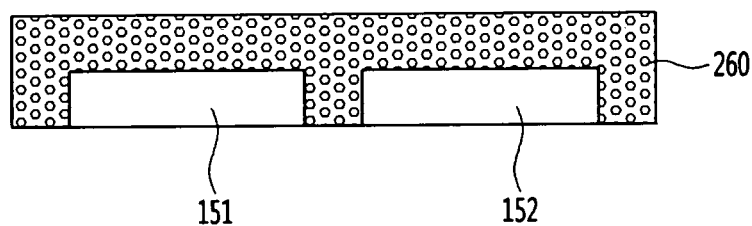
FIG. 8 is a cross-sectional view taken along line A-A of the light emitting device of FIG. 7.
Figure 9:
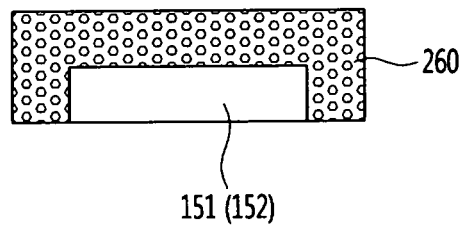
FIG. 9 is a cross-sectional view taken along the line B-B of the light emitting device of FIG. 7.

Referring to FIGS. 7 to 9, the light emitting device 100 according to the embodiment may include light emitting chips 151 and 152. Each of the light emitting devices 100 may include two or more light emitting chips 151 and 152. The two or more light emitting chips 151 and 152 may be arranged in the length direction of the optical lens 300. The two or more light emitting chips 151 and 152 may be spaced apart from each other. The light emitting device 100 according to the embodiment includes first and second light emitting chips 151 and 152 and the first and second light emitting chips 151 and 152 may be disposed with a long length in the length direction of the optical lens 300.

The light emitting chips 151 and 152 may include at least one of an LED chip having a compound semiconductor such as an ultraviolet (UV) LED chip, a blue LED chip, a green LED chip, a white LED chip, and a red LED chip. The light emitting chips 151 and 152 may include at least one or both of Group II-VI compound semiconductors and Group III-V compound semiconductors. The light emitting chips 151 and 152 may emit at least one of blue, green, blue, UV, and white light. The light emitting chips 151 and 152 may emit the lights having the same peak wavelength or the lights having a different peak wavelengths. The light emitting chips 151 and 152 may emit light of the same color or different colors.

The light emitting device 100 according to the embodiment may be disposed on the circuit board 400 without additional wire bonding. At least one or both of the light emitting chips 151 and 152 may be mounted on the circuit board 400 in a flip chip bonding manner. The light emitting device 100 shown in FIG. 7 may be a device that emits light through the upper surface and a plurality of side surfaces, or a device that emits light through at least five surfaces, thereby improving light extraction efficiency.

The light emitting device 100 may include a resin layer 260 disposed on the light emitting chips 151 and 152. The resin layer 260 may be disposed on the upper surface of the light emitting chips 151 and 152. The resin layer 260 may be disposed on the upper surface and all sides of the light emitting chips 151 and 152. The resin layer 260 may include a light transmissive material, for example, an epoxy or a silicon material. The resin layer 260 may include a phosphor therein, and the phosphor may emit light having a longer wavelength than that emitted from the light emitting chips 151 and 152.

The phosphor may include at least one or more of a blue phosphor, a cyan phosphor, a green phosphor, a yellow phosphor, and a red phosphor, and may be disposed in a single layer or in multiple layers. In the phosphor film, a phosphor is added in the light transmitting resin material. The transmissive resin material may include a material such as silicone or epoxy, and the phosphor may be selectively formed from YAG, TAG, silicate, nitride, and oxy-nitride materials. The resin layer 260 may include a phosphor material such as a quantum dot. The quantum dot may include an II-VI compound or an III-V compound semiconductor, and may include at least one of red, green, yellow, and red quantum dots or different types. The quantum dots are nanometer sized particles that may have optical properties resulting from quantum confinement. The specific composition(s), structure and/or size of the quantum dot may be selected so that light of a desired wavelength is emitted from the quantum dots upon excitation with a specific excitation source. By changing the size, the quantum dots may be adjusted to emit light throughout the visible spectrum. The quantum dot may include one or more semiconductor materials, and examples of the semiconductor material include a group IV element, a group II-VI compound, a group II-V compound, a group III-VI compound, a group III-V compound, a group IV-VI compound, a group compound, a group II-IV-VI compound, a group II-IV-V compound, an alloy thereof, and/or 3-membered and 4-membered mixtures or alloys thereof, and mixtures thereof. Examples of the quantum dot may be ZnS, ZnSe, ZnTe, CdS, CdSe, CdTe, GaN, GaP, GaAs, GaSb, InP, InAs, InSb, AlS, AlP, AlAs, PbS, PbSe, Ge, Si, CuInS2, CuInSe2, MgS, MgSe, MgTe, and combinations thereof.

The light emitted from the light emitting chips 151 and 152 and the wavelength excited by the phosphor may be emitted by the light emitting chips 151 and 152 and the resin layer 260 to which the phosphor is added. The light emitting device 100 may emit white light. As shown in FIG. 8, the resin layer 260 is disposed between the first and second light emitting chips 151 and 152 to prevent the first and second light emitting chips 151 and 152 from contacting each other.

Figure 10:
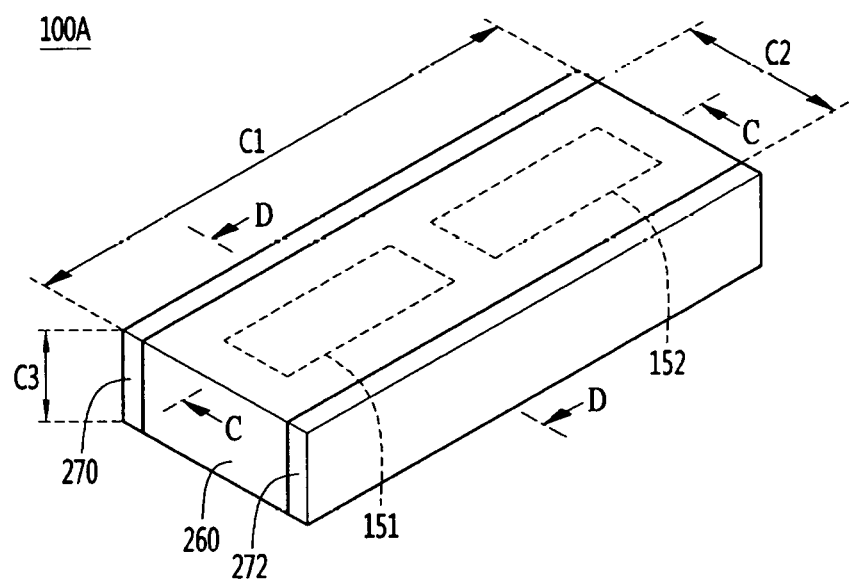
FIG. 10 is a first modification of the light emitting device in the light unit according to the embodiment.
Figure 11:
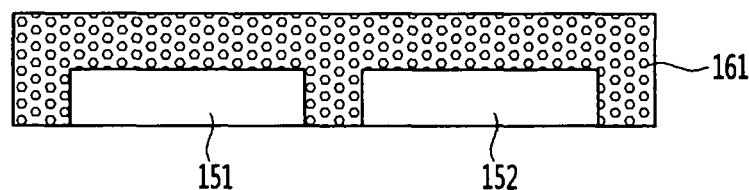
FIG. 11 is a cross-sectional view taken along the line C-C of the light emitting device of FIG. 10.
Figure 12:
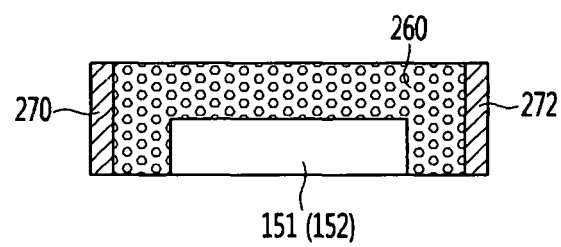
FIG. 12 is a cross-sectional view taken along a line D-D of the light emitting device of FIG. 10.

As another example of the light emitting device according to the embodiment, referring to FIGS. 10 to 12, a light emitting device 100A includes at least one or more light emitting chips 151 and 152, a resin layer 260 on the light emitting chips 151 and 152, and reflective sidewalls 270 and 272 on both sides of the resin layer 260. The light emitting chips 151 and 152 151 and 152 and the resin layer 260 will be described with reference to the above description of the embodiments.

The reflective sidewalls 270 and 272 may be disposed on at least two sides of the resin layer 260, for example, on the first and second side opposite to each other. The reflective sidewalls 270 and 272 may be adjacent to or corresponding to the first and second incident surfaces 312 and 314 of the optical lens 300 of FIG. 2. A length of the reflective sidewalls 270 and 272 may be the same as the length C1 of the light emitting device 100A and the height may be equal to or less than the thickness C3 of the light emitting device 100. The reflective sidewalls 270 and 272 may be disposed on the first and second side surfaces of the resin layer 260 to reflect light traveling in the first and second lateral directions of the light emitting device 100A. The thickness of the reflective sidewalls 270 and 272 (thickness in the horizontal direction) may be 150 μm or more, for example, in a range of 150 μm to 200 μm. If the thickness of the reflective sidewalls 270 and 272 is less than the above range, the light may leak or the sidewalls may collapse. If the thickness is greater than the above range, the size of the light emitting device 100A is increased and the recesses 315 and the recess 315 of the optical lens 300 in FIG. 2 may be changed.

The reflective sidewalls 270 and 272 may include a resin material, and the resin material may include a metal compound therein. The metal compound may be selectively formed of SiO2, Si3N4, Al2O3, or TiO2. The reflective sidewalls 270 and 272 may be laminated in a single layer or in multiple layers made of resin, but the invention is not limited thereto.

As another example, the reflective sidewalls 270 and 272 may be made of a metal, and may be may be selected of a metal having a reflectance of 70% or more, for example, a metal of Al, Ag, Ru, Pd, Rh, Pt, Ir and an two or more alloy among the metals. The reflective sidewall may be formed as a single layer or a multi-layer structure made of metal.

The light emitting device 100A may emit the light emitted from the light emitting chips 151 and 152 or the wavelength-converted light from the phosphors. The reflective sidewalls 270 and 272 may reflect the incident light toward the upper surface of the light emitting device. Here, since the reflective sidewalls 270 and 272 of the light emitting device reflect a part of the light that travels to the first and second incident surfaces 312 and 314 of the optical lens 300, a distribution of light travelling to the side surface of the optical lens 300 may be adjusted. The light emitting device 100A may emit light through the upper surface and third and fourth side surfaces (a side surface in the length direction of the optical lens), thereby reducing the occurrence of dark portions between adjacent light emitting devices.

Figure 43:
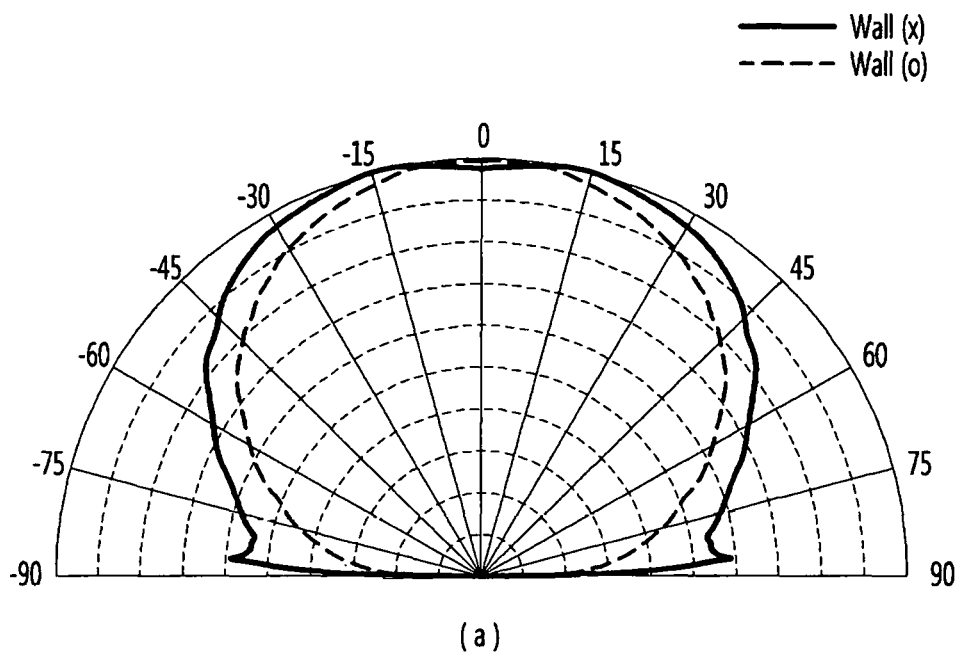
FIGS. 43(a) and 43(b) are diagrams comparing a beam angle distributions of a light emitting device according to the embodiment and a light emitting device having reflective sidewalls.
Figure 43:
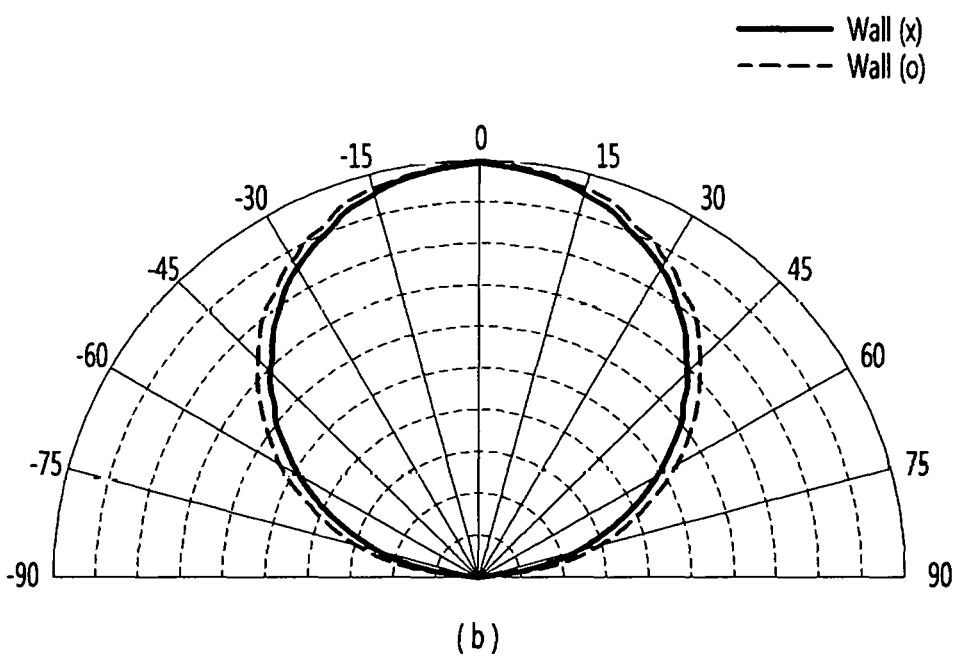

As shown in FIGS. 43(a) and 43(b), when the beam angle distributions of the light-emitting devices 100 and 100A according to the embodiment are compared, as the beam angel distribution of the light emitting device 100 without the reflective sidewall and the light emitting device 100 A with the reflective sidewall, the beam angle distribution of the light emitting device having no reflective sidewall in the long axis direction (a length direction) is wider and the beam angle distribution of the light emitting device being the reflective sidewall in the shorter axis direction (a width direction) is wider.

Figure 13:
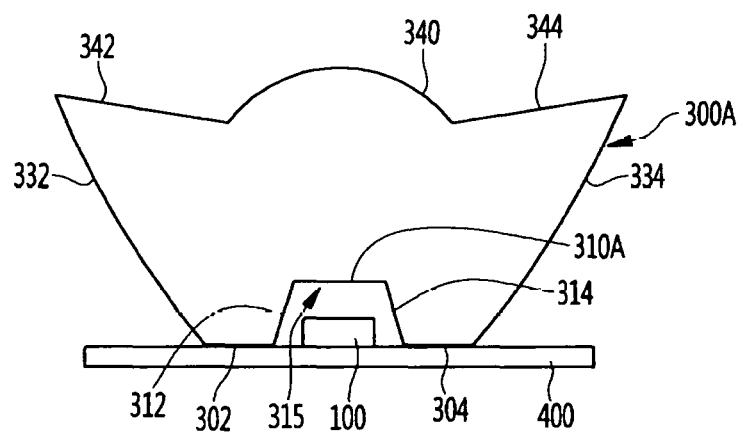
FIG. 13 is a view showing a first modification of the optical lens in the light unit according to the first embodiment.

FIG. 13 is a first modification of the optical lens of FIG. 2, in which a part of the incident surface of the optical lens is modified. The parts which are the same as those of the optical lens described above will be omitted.

Referring to FIG. 13, the optical lens 300A may include bottom surfaces 302 and 304, a recess 315, a plurality of incident surfaces 310A, 312 and 314, and a plurality of exit surfaces 340, 342, and 344. A first incident surface 310A of the plurality of incident surfaces 310A, 312, and 314 may have a flat surface or a horizontal surface. When the first incident surface 310A is a flat surface, the incident efficiency may be improved. Since the angle of refraction of the incident light of the first incident surface 310A is changed, the width of the first exit surface 340 may become greater. The first incident surface 310A may include a concavo-convex structure for incident efficiency, but the invention is not limited thereto. The second and third incident surfaces 312 and 314 of the recess 315 may be convex in the direction of the recess 315.

Figure 14:
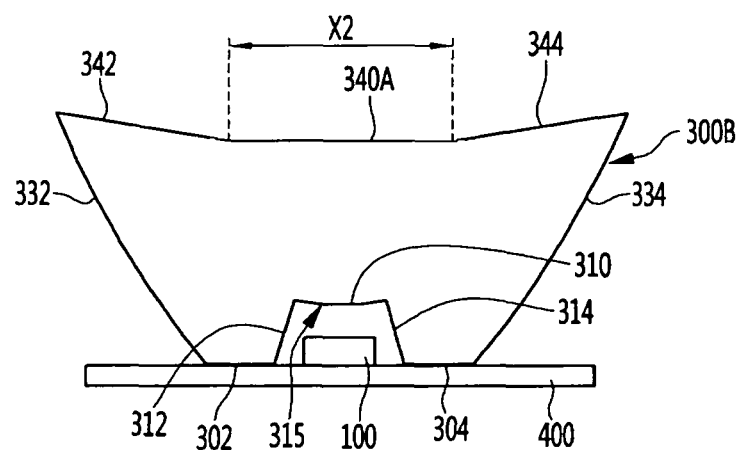
FIG. 14 is a view showing a second modification of the optical lens in the light unit according to the first embodiment.

FIG. 14 is a second modification of the optical lens of FIG. 2, in which the exit surface of the optical lens is modified. As shown in FIG. 14, the optical lens 300B includes a plurality of exit surfaces 340A, 342, and 344, and the plurality of exit surfaces 340A, 342, and 344 have the same length as that of the optical lens 300 as shown in FIG. 1. Among the plurality of exit surfaces 340A, 342, and 344, the center-side first exit surface 340A may be a flat surface rather than a convex curved surface. The first exit surface 340A may be disposed at a position lower than the second and third exit surfaces 342 and 344 and may diffuse the light incident on the first incident surface 310. When the first exit surface 340A is a convex curved surface, light incident is condensed, and when the first exit surface 340A is a flat surface, light incident may be dispersed.

Figure 15:
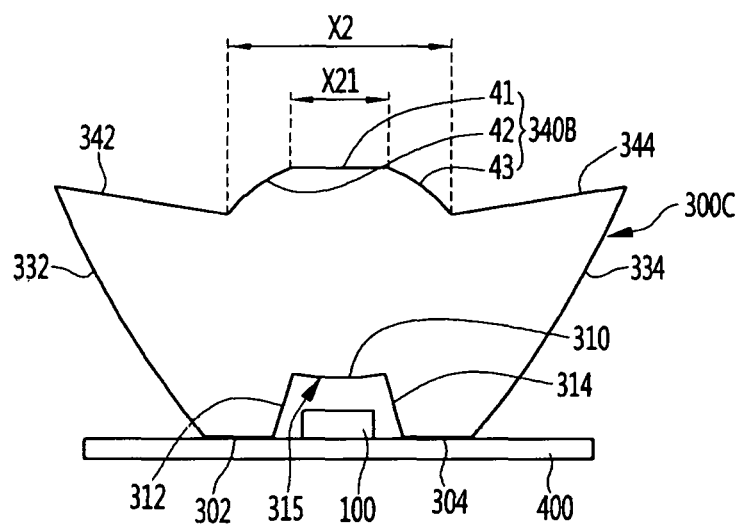
FIG. 15 is a view showing a third modification of the optical lens in the light unit according to the first embodiment.

FIG. 15 shows a third modification of the optical lens of FIG. 2, in which a part of the exit surface of the optical lens is modified. The parts which are the same as those of the optical lens described above will be omitted.

As shown in FIG. 15, among the exit surfaces 340B, 342, and 344 of the optical lens 300C, the center-side first exit surface 340B has a flat first region 41 and second and third regions 42 and 43 having a curved surface on both sides of the first region 41. The width X21 of the first region 41 may be equal to or less than half the width X2 of the first exit surface 340B and the light incident on the first region 41 of the first exit surface 340B by the width X21 can be diffused and emitted. Since the second and third regions 42 and 43 are provided as curved surfaces, the light incident on the first incident surface 310 is refracted and emitted as parallel light.

One or a plurality of first regions 41 of the first exit surface 340B may be disposed along the length direction of the optical lens of FIG. 1. For example, a plurality of first regions 41 are disposed in a region overlapping the light emitting device 100 on the first exit surface 340, and a region between the first regions 41, that is, the region between the light emitting devices may be curved or other planes.

Second Embodiment

Figure 16:
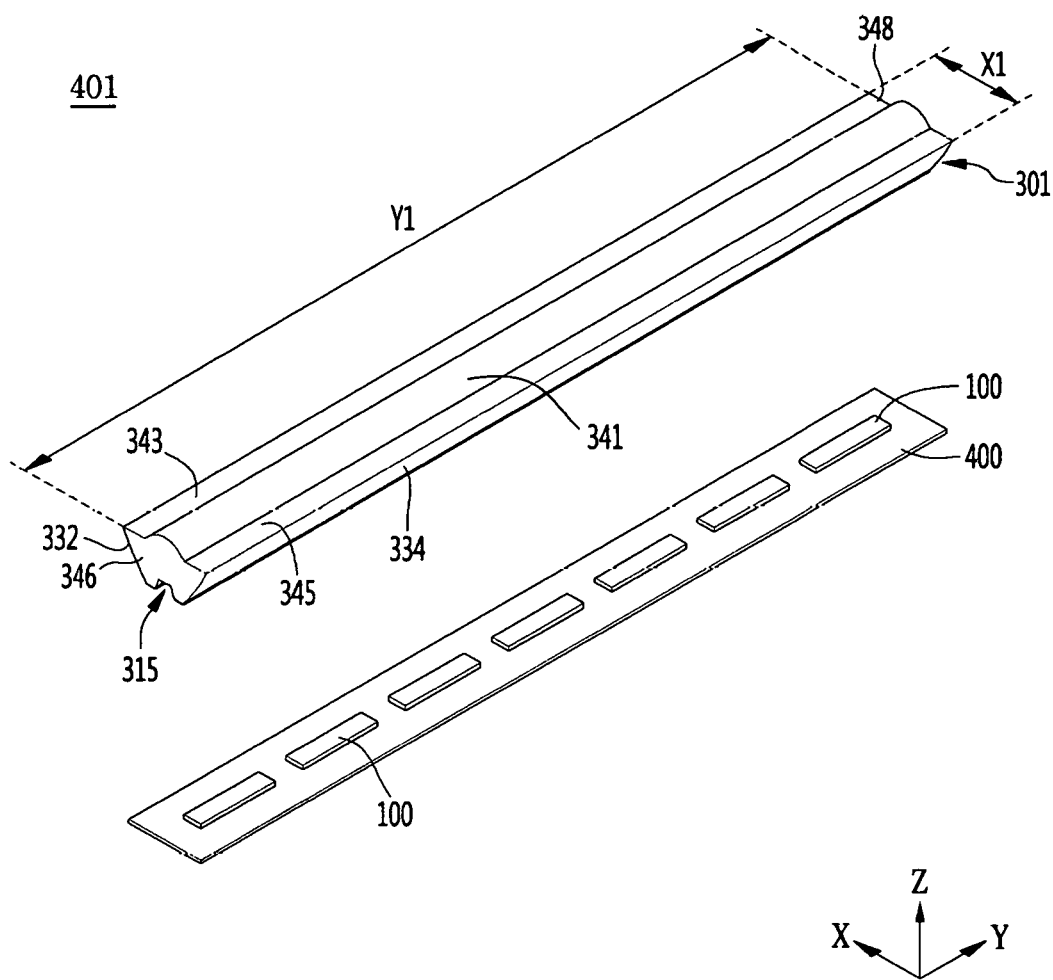
FIG. 16 is a perspective view of a light unit having an optical lens according to the second embodiment.
Figure 17:
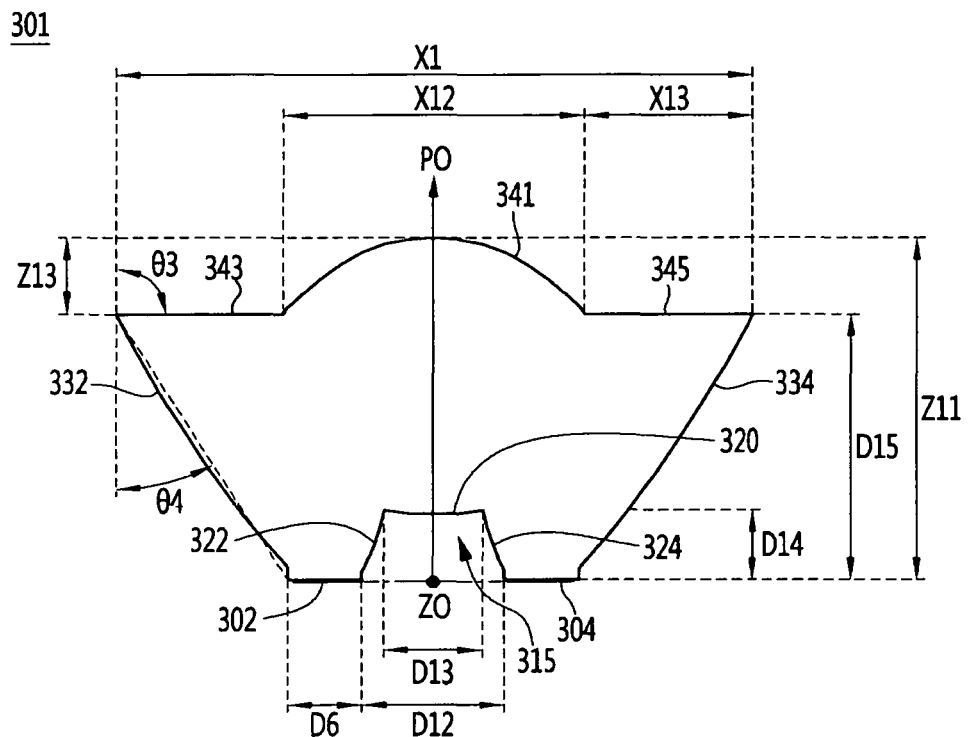
FIG. 17 is a side cross-sectional view taken along the optical lens of FIG. 16.
Figure 18:
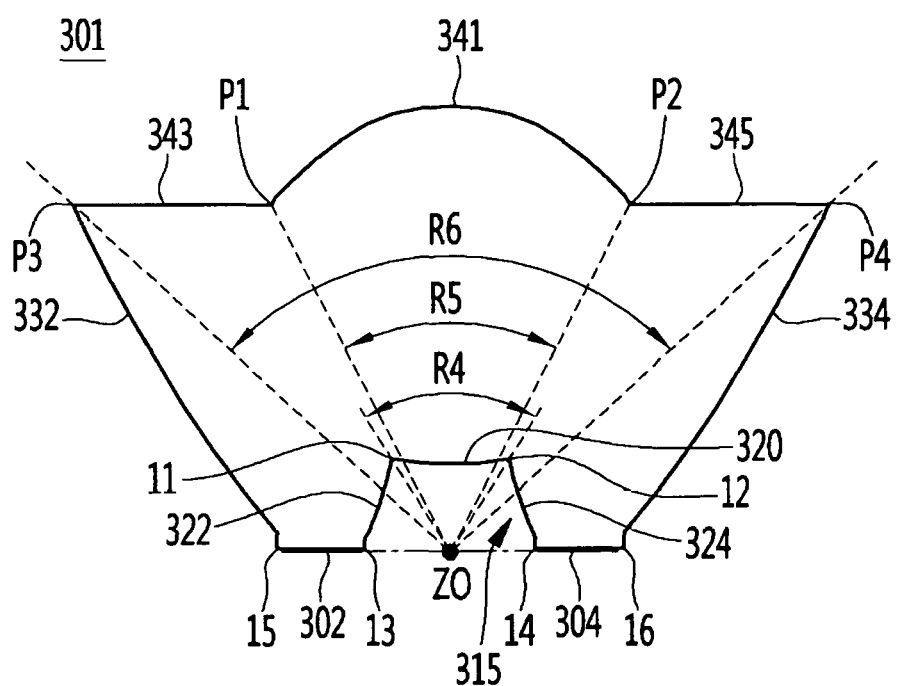
FIG. 18 is a view for explaining the optical lens of FIG. 16.

FIG. 16 is a perspective view of a light unit having an optical lens according to the second embodiment, FIG. 17 is a side sectional view of the optical lens of FIG. 16, and FIG. 18 is a view for explaining an incident surface and an exit surface of the optical lens of FIG. 17. In describing the second embodiment, the same configuration as that of the first embodiment described above may be selectively applied to the second embodiment with reference to the description of the first embodiment.

Referring to FIGS. 16 to 18, the light unit 401 includes the optical lens 301 according to the second embodiment. The light unit 401 includes a circuit board 400, a plurality of light emitting devices 100, and an optical lens 301.

Referring to FIGS. 17 and 18, the optical lens 301 includes a plurality of bottom surfaces 302 and 304, a recess 315 between the plurality of bottom surfaces 302 and 304, a plurality of incident surfaces 320, 322, and 324 on an outer sides of the recess 3150, a plurality of exit surfaces 341, 343 and 345 and a plurality of total reflective surfaces 332 and 334. In the optical lens 301 according to the second embodiment, as the shapes of the exit surfaces 341, 343, and 345 are changed, the sizes of the incident surfaces 320, 322, and 324 and the exit surface may be changed.

The thickness Z11 of the optical lens 301 may be 1.4 times or more, for example, in a range of 1.5 times to 1.6 times the width X1 of the optical lens 301. The optical lens 301 diffuses incident light and emits the light.

The second and third exit surfaces 343 and 345 disposed on both sides of the first exit surface 341 may be arranged in a horizontal surface. Since the second and third exit surfaces 343 and 345 are provided in a horizontal surface, the length Y1 of the optical lens 301 is at least three times the width X1, for example, four times or more, or in a range of four times to six times the width X1. When the length Y1 of the optical lens 301 exceeds the above range, the optical lens 301 may be bent, when the length of the optical lens 301 is smaller than the above range, a number of the optical lens 301 mounting to the light apparatus may be increased.

Referring to FIG. 17, the second and third exit surfaces 343 and 345 may be disposed in an angle θ3 of 90±2 with respect to a vertical axis P0 or a straight line. The first and second total reflective surfaces 332 and 334 of the optical lens 301 are disposed in an angle θ4 of 25 degrees, for example, in a range of 25 degrees to 35 degrees from a straight line connecting both edges of the first and second total reflection surfaces 332 and 334 with respect to a vertical axis P0 or a vertical straight line. The first and second total reflective surfaces 332 and 334 may have curved surfaces protruding outwardly from a straight line connecting both edges.

The first and second total reflective surfaces 332 and 334 may have a stepped structure in a region adjacent to the bottom surfaces 302 and 304. This may ensure the width of the bottom surfaces 302 and 304 by the stepped structure and may secure the rigidity of the supporting protrusions protruding from the bottom surfaces 302 and 304 by the stepped structure.

The width of the first exit surface 341 may be in the range of more than one time, for example, in a range of 1.5 times to twice the width of the second and third exit surfaces 343 and 345. A ratio of the width of the second or third exit surface and the width of the first exit surface 341 may be in the range of 1:1.5 to 1:1.9. The width of the first exit surface 341 may be in a range of 6 mm or more, for example, in a range of 6.5 mm to 8 mm. when the width of the first exit surface 341 is smaller than the above range, the light efficiency at the center side may be lowered, and when the width of the first exit surface 341 is greater than the above range, an improvement of the light efficiency at the center side may be insignificant.

The sizes of the incident surfaces 320, 322, and 324 may be changed to correspond to the exit surface of the optical lens 301 according to the second embodiment. The incident surfaces 320, 322 and 324 include a first incident surface 320 on the recess 315 and second and third incident surfaces 322 and 324 on opposite sides of the recess 315. The first incident surface 320 may include a curved surface protruding in a bottom direction, and the second and third incident surfaces 322 and 324 may be a curved surface or an inclined plane protruding in a direction of the recess 315.

The width D13 of the first incident surface 320 may be equal to or less than ¼ of the width X12 of the first exit surface 341, for example, in a range of 2 mm to 3 mm. The ratio of the width D13 of the first incident surface 320 and the width X12 of the second exit surface 341 may range from 1:2.7 to 1:3.3.

The difference between the upper width D13 and the bottom width D12 of the recess 315 may be 0.8 mm or more, for example, in a range of 0.8 mm to 1.2 mm. The bottom width D12 of the recess 315 may be 3 mm or more, for example, in a range of 3 mm to 4 mm, and the upper width D13 of the recess 315 may be in the range of 2 mm to 2.8 mm. The bottom width D13 of the recess 315 may be wider than the width of the light emitting device described later. The upper width D12 of the recess 315 may be wider than the width of the light emitting device described later.

Referring to FIG. 18, in the optical lens 301, a first angle R4 between straight lines passing through both edges 112 and 12 of the first incident surface 320 with respect to the bottom center ZO of the recess 315 is 60 degrees or more, for example, in a range of 60 degrees to 70 degrees. This first angle R4 between the both the edges 11 and 12 of the first incident surface 320 with respect to the bottom center ZO of the recess 315 may be varied depending on the beam angle of the light emitting device. The first angle R4 may be greater than a second angle R5 between a both edges of the first exit surface 341 with respect to the bottom center ZO of the recess 315. The difference between the first angle R4 and the second angle R5 may have a difference of 8 degrees or more, for example, in a range of 8 degrees to 15 degrees. When a difference between the first and second angles R4 and R5 is smaller than or greater than the above range, the thickness of the optical lens 301 may be influenced or the light efficiency may be changed.

The third angle R6 between the two edges P3 and P4 of the second and third exit surfaces 343 and 345 with respect to the bottom center ZO of the recess 315 may have greater than 90 degrees, for example, in a range of 91 degrees to 100 degrees. The third angle R6 may distinguish a regions of the second and third exit surfaces 343 and 345 and a regions of the first and second total reflective surfaces 332 and 334.

As shown in FIG. 17, in the first and second total reflective surfaces 332 and 334, an angle θ4 between a straight lines connecting both edges (P3-15 and P4-16 in FIG. 18) may be 50 degrees or less, for example, in a range of 25 degrees to 35 degrees. The first and second total reflective surfaces 332 and 334 may have a curved surface protruding outward from a straight lines connecting both edges (P3-15 and P4-16 in FIG. 18). Since the straight lines connecting the both edges (P3-15, P4-16 in FIG. 18) of the first and second total reflective surfaces 332 and 334 provides an inclined surface with respect to the vertical axis, the second and third exit surfaces 343 and 345 may be reflected the light incident through the second and third incident surfaces 322 and 324. The beam angle distribution of the light emitted from the optical lens 301 according to the embodiment may be found in a range of 30 degrees or less, for example, in a range of 20 degrees to 30 degrees, with respect to the central axis as shown in FIG. 42(b).

Figure 19:
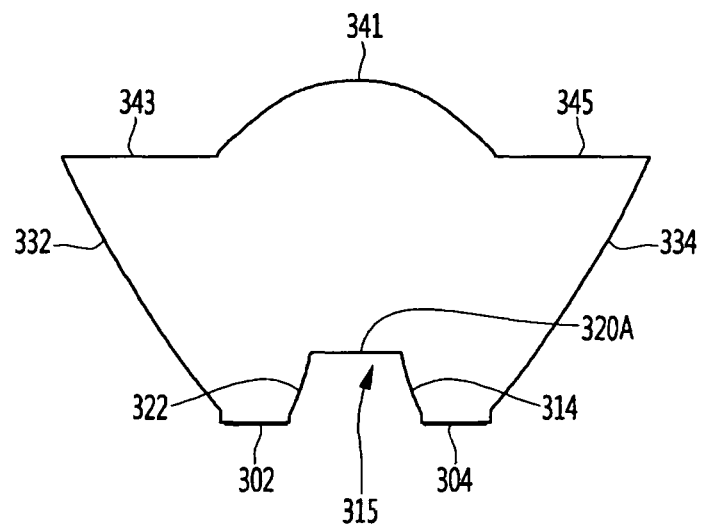
FIG. 19 is a view showing a first modification of the optical lens of FIG. 17
Figure 20:
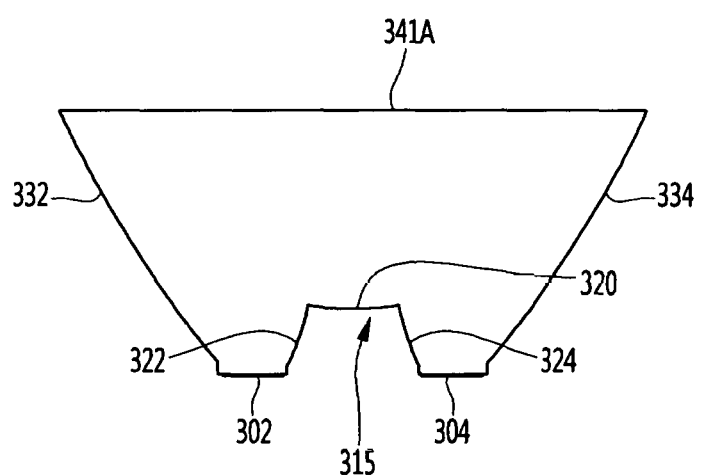
FIG. 20 is a view showing a second modification of the optical lens of FIG. 17
Figure 21:
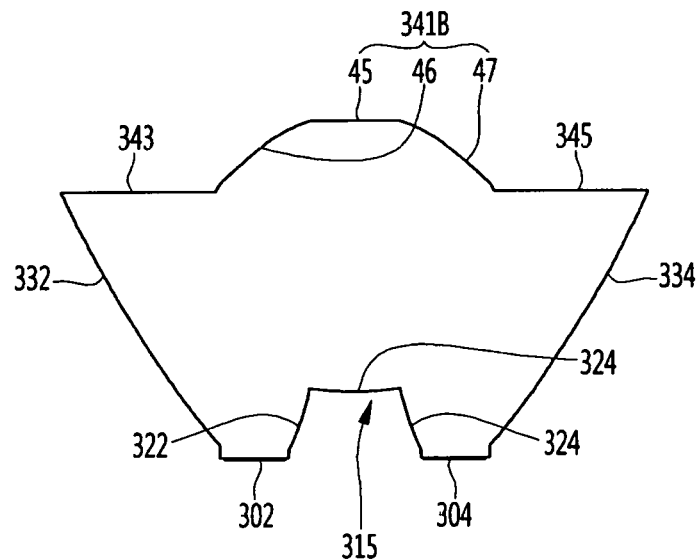
FIG. 21 is a view showing a third modification of the optical lens of FIG. 17

Referring to FIGS. 19 to 21 are views showing first to third modifications of the optical lens of FIG. 17. These modifications may optionally be applied to the embodiments disclosed above.

Referring to FIG. 19, the optical lens may include bottom surfaces 302 and 304, a recess 315, a plurality of incident surfaces, and a plurality of exit surfaces 341, 343, and 345. The first incident surface 320 of the plurality of incident surfaces 320A, 322, and 324 may have a flat surface or a horizontal surface. When the first incident surface 320A is a flat surface, the incident efficiency may be improved. Since the angle of refraction of the incident light of the first incident surface 320A is changed, a width of the first exit surface 341 may become large. The second and third incident surfaces 322 and 324 of the recess 315 may be convex in the direction of the recess 315.

Referring to FIG. 20 is a second modification of the optical lens of FIG. 17. The overlapped portions of the description of the optical lens described above will be omitted, and the present invention may be selectively applied to the embodiments disclosed above. Referring to FIG. 20, the exit surface of the optical lens of FIG. 17 is modified. The optical lens includes an exit surface 341A, and the exit surface 341A may have a length equal to the length Y1 of the optical lens as shown in FIG. 1. Among the exit surfaces 341A, the center and side exit surfaces may include flat surfaces rather than convex curved surfaces.

FIG. 21 shows a third modified example of the optical lens of FIG. 17, in which a part of the exit surface of the optical lens is modified. The overlapped portions of the description of the optical lens described above will be omitted, and the present invention may be selectively applied to the embodiments disclosed above.

As shown in FIG. 21, among the exit surfaces 341B, 343 and 345 of the optical lens, a central first exit surface 341B has a flat first region, a second and a third regions 46 and 47 having curved surfaces on both sides of the first region 45. The width of the first region 45 may be equal to or less than half the width of the first exit surface 341. The first region 35 of the first exit surface 341 may be diffused and emitted by the width. Since the second and third regions 46 and 47 are provided as curved surfaces, the light incident on the first incident surface 320 is refracted and emitted in parallel.

One or plurality of first regions 45 of the first exit surface 341 may be disposed along the length direction of the optical lens of FIG. 1. For example, a plurality of first regions may be disposed in a region overlapping the light emitting device on the first exit surface 341, and a region between the first regions, that is, a region between the light emitting devices may be a curve surface or a different plane.

Third Embodiment

Figure 22:
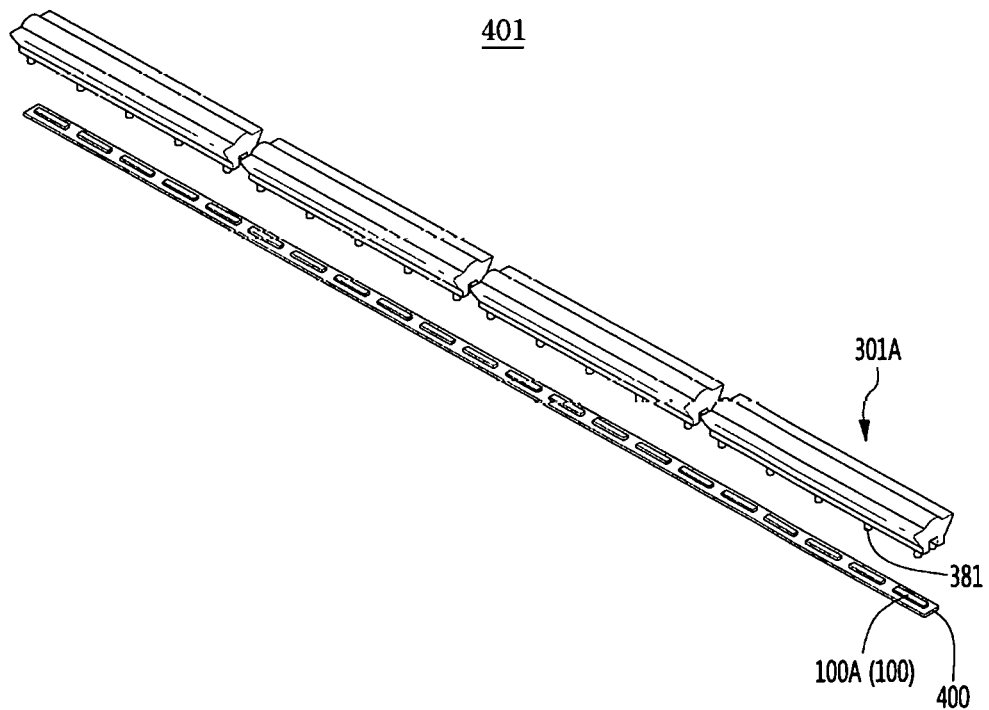
FIG. 22 is a perspective view of a light unit according to the third embodiment.
Figure 23:
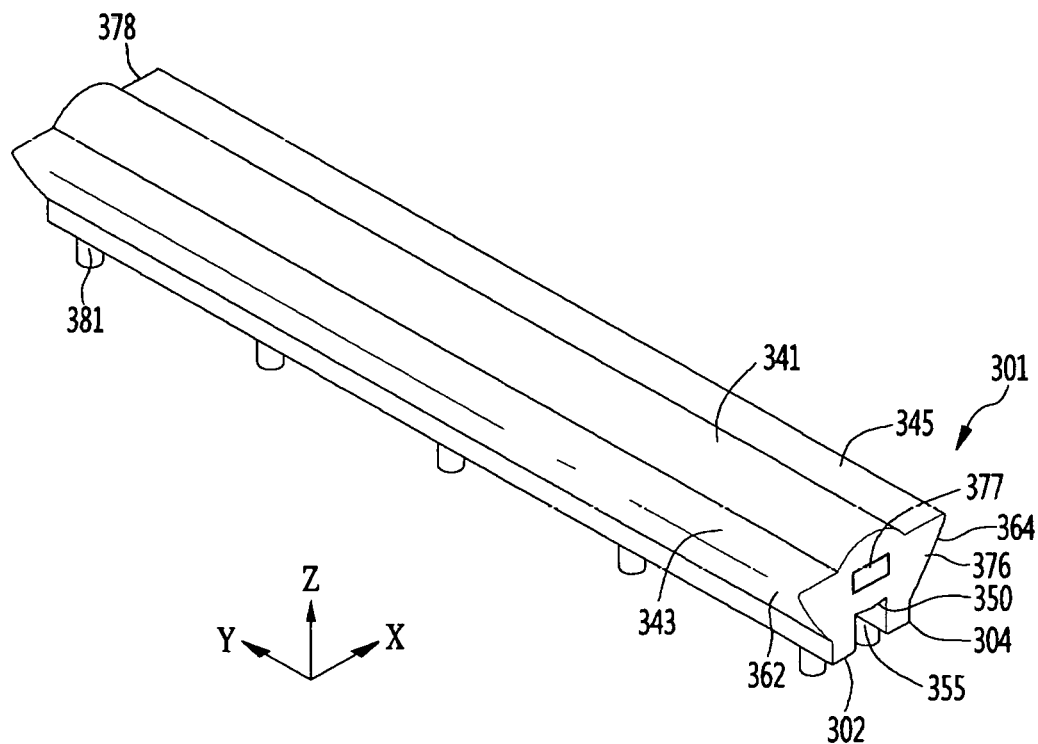
FIG. 23 is a perspective view showing the optical lens of the light unit of FIG. 22
Figure 24:
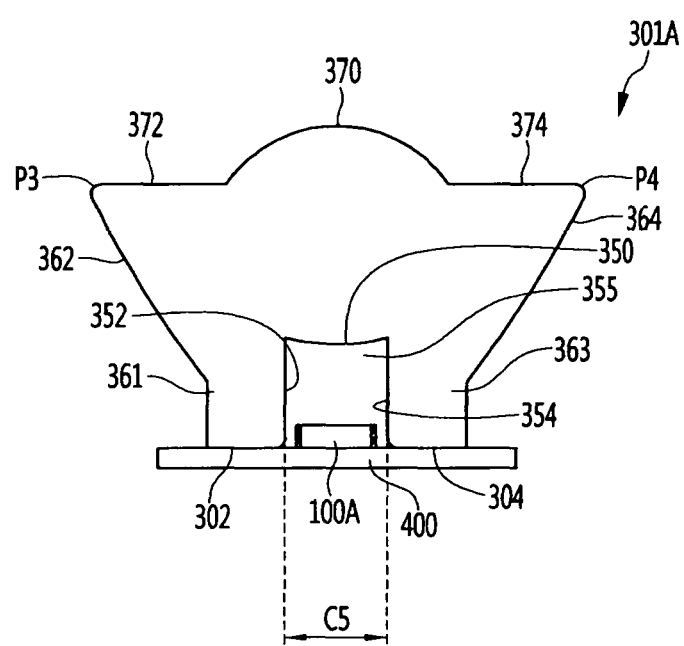
FIG. 24 is a cross-sectional side view for coupling of the light unit of FIG. 22.
Figure 25:
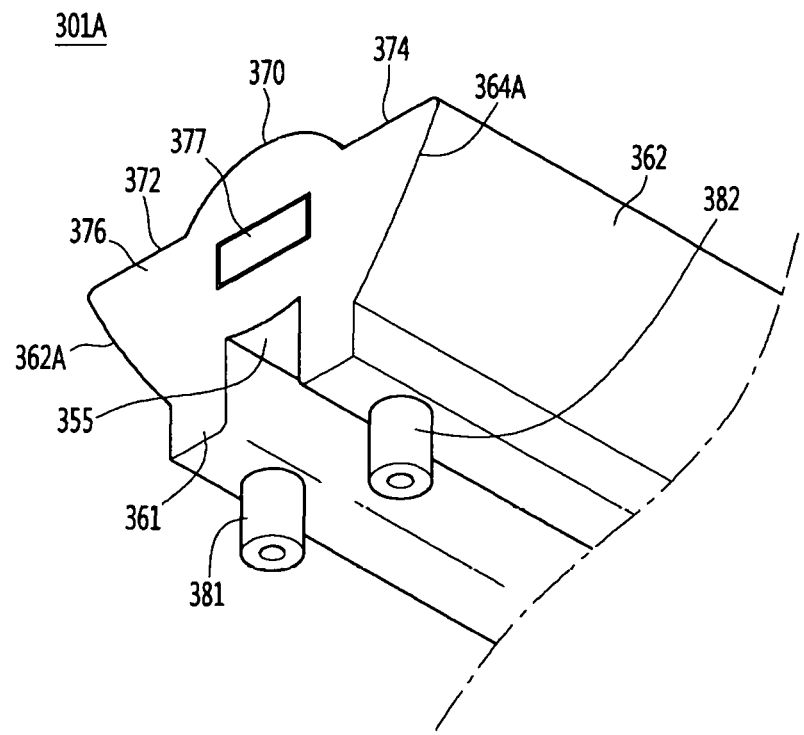
FIG. 25 is a perspective view showing supporting protrusion of the optical lens in the light unit of FIG. 22.

FIG. 22 is a perspective view of a light unit having an optical lens according to the third embodiment, FIG. 23 is a view showing an optical lens of the light unit of FIG. 22, FIG. 24 is an assembled side cross-sectional view of the light unit of FIG. 22, and FIG. 25 is a view showing support protrusions of the optical lens in the light unit of FIG. 22.

Referring to FIGS. 22 to 25, the light unit 401 includes a circuit board 400, a plurality of light emitting devices 100 according to an embodiment disposed on the circuit board 400, and a plurality of optical lenses 301A on the circuit board 400.

The light emitting device 100 may be disposed between the optical lens 301A and the circuit board 400. The light emitting device 100 may be disposed at a higher than the bottom surfaces 302 and 304 of the optical lens 301A.

The length and the width of the optical lens 301A will be described with reference to the configuration of FIG. 16. In the optical lens 301A, the second and third exit surfaces 372 and 374 among the exit surfaces 370, 372 and 374 are arranged in a horizontal plane and a boundary region P3 and P4 between the first and second total reflective surfaces 362 and 364 is an edge region and may be an angular surface or a curved surface. This may be provided by the injection or extrusion process to provide the edge regions of the first and second exit surfaces 372 and 374 as curved surfaces.

The first and second bottom surfaces 302 and 304 of the optical lens 301A may be disposed on the upper surface of the circuit board 400 or may be disposed on the inner side than the upper surface of the circuit board 400.

The optical lens 301A includes a plurality of leg portions 361 and 363 and the plurality of leg portions 361 and 363 may protrude to both sides of the recess 315. The leg portions 361 and 363 have the same length as the length of the optical lens 301A and may support the optical lens 301A.

The recess 315 includes first to third incident surfaces 350, 352 and 354, and the first incident surface 350 may be a convex curved surface or a flat surface in the direction of the light emitting device. The second and third incident surfaces 322 and 324 are disposed on both sides of the light emitting device 100A and refract the incident light to the first and second total reflective surfaces 362 and 364. The second and third incident surfaces 322 and 324 may be arranged in a plane perpendicular to the horizontal axis, or may be curved or inclined.

A width C5 of the recess 315 of the optical lens 301A may be an interval between the first and second leg portions 361 and 363 and may be wider than the width of the light emitting device 100A. Here, the light emitting device 100A may be the same as the light emitting device shown in FIG. 12 or the light emitting device shown in FIG. 7. At this time, the light emitted from the light emitting device 100A travels to the upper region of the first and second leg portions 361 and 363, so that the light may be incident on the first and second total reflective surfaces 362 and 364.

Referring to FIG. 25, the optical lens 301A may be provided with a plurality of support protrusions 381 and 382 to the bottom surfaces 302 and 304. The plurality of support protrusions 381 and 382 may be coupled to the circuit board 400 or another fixing structure to fix the optical lens 301A. A bottom view shape of the plurality of support protrusions 381 and 382 may have a circular shape, a polygonal shape, or an elliptical shape.

As shown in FIGS. 23 and 25, side protrusion 377 may be disposed on an outer sidewalls 376 and 378 disposed in the longitudinal direction of the optical lens 301A. The side protrusion 377 may be disposed on one or both of the length direction of the body or the length direction of the optical lens 301A and may include a gate region for injection molding of the optical lens 301A. The outer sidewalls 376 and 378 of the optical lens 301A may be a surface perpendicular to the Z-axis direction or a tilted surface. Since the side protrusion 377 is disposed in regions that do not affect the optical characteristics, the light loss may be reduced. The width of the side protrusion 377 may be 2 mm, for example, in the range of 2 mm to 4 mm, a protrusion thickness may be 0.3 mm, for example, in a range of 0.3 mm to 0.7 mm, and a height may be 1 mm or more, for example, in a rage of 1 mm to 2 mm. A size of the side protrusion 377 may vary depending on the gate.

The boundary regions 362A and 364A between the total reflective surfaces 362 and 364 and the outer sidewalls 376 and 378 may be angled or curved surface. In a case of the curved surface, a radius of curvature may range from 0.2 mm to 0.6 mm. The boundary regions 362A and 364A having such a radius of curvature may be easily separated during injection molding.

Figure 26:
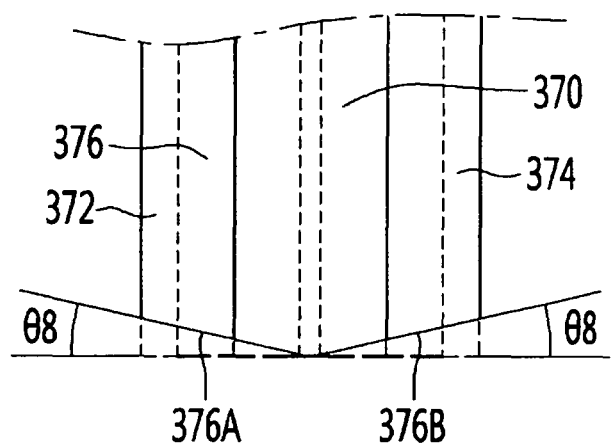
FIG. 26 is a plan view showing an example of the outer sidewall of the optical lens according to the embodiment.

Referring to FIG. 26, the outer sidewalls 376A and 376B may be disposed on an inclined surface in an outward direction (X-axis direction) with respect to the center to facilitate separation in the injection process. The outer sidewalls 376A and 376B of the optical lens 301A may be at an angle θ8 of 5 degrees or less, for example, 4 degrees or less with respect to a horizontal straight line, if it is exceeding the above range, a light loss may cause, and if it is less than the above range, the effect of improving the separation efficiency of the injection lens 301A may be insignificant. Embodiments may provide an inclined structure in the outer sidewalls 376A and 376B of the optical lens 301A to reduce light loss and facilitate separation in the manufacturing process.

Figure 27:
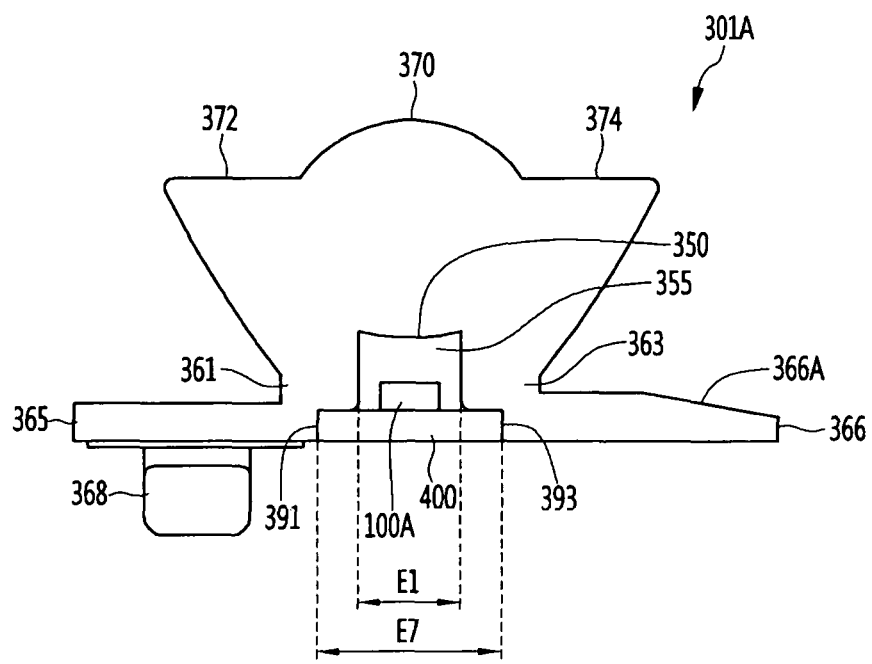
FIGS. 27 to 29 are views showing a modification of the support projection of the optical lens according to the embodiment.
Figure 28:
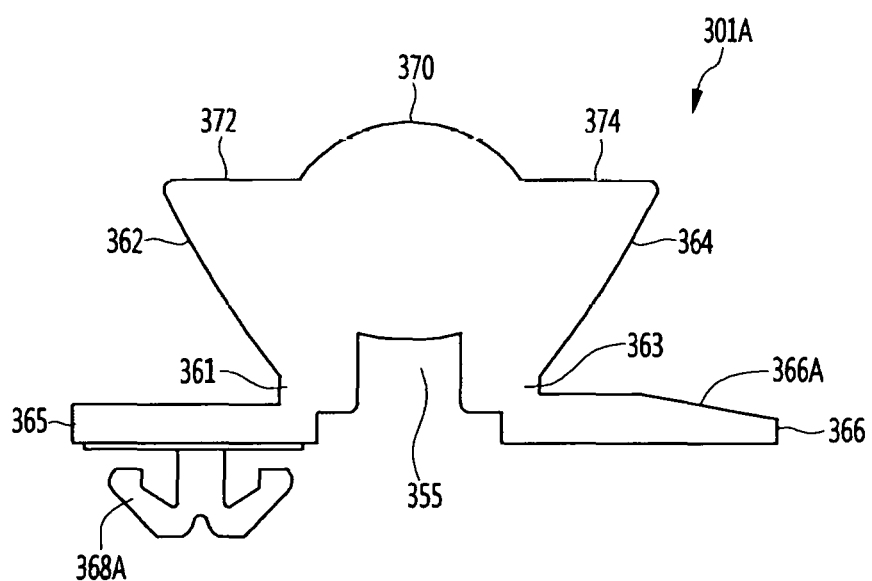
Figure 29:
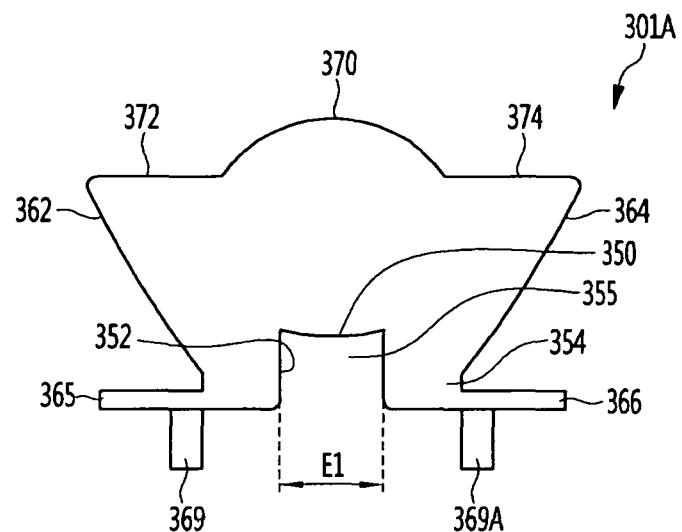

Referring to FIGS. 27 to 29 are views for explaining a coupling structure of the optical lens 301A according to the embodiment.

Referring to FIG. 27, the optical lens 301A may have receiving grooves 391 and 393 at the bottom. The receiving grooves 391 and 393 may extend to both sides of the lower portion of the recess 355. The receiving grooves 391 and 393 are disposed under each of the leg portions 361 and 363 to provide a receiving space. A width E7 of the lower region having the receiving grooves 391 and 393 may be wider than the width E1 of the recess 315. The width E7 of the receiving grooves 391 and 393 may be wider than the width of the circuit board 400. Accordingly, the circuit board 400 may be inserted into the lower region where the receiving grooves 391 and 393 are disposed.

The optical lens 301A includes first and second bottom portions 365 and 366 extending outward from the bottom of the leg portions 361 and 363 and at least one or both of the first and second bottom portions 365 and 366 may include one or more of coupling protrusion 368. The coupling protrusion 368 may have a protrusion structure having a locking protrusion in the length direction as shown in FIG. 27, a protrusion structure 368A having a locking protrusion in the width direction as shown in FIG. 28, or columnar structures 369 and 369A protruding vertically as shown in FIG. 29. The coupling protrusions may be coupled to a structure such as a bottom cover.

As shown in FIGS. 27 and 28, any one of the first and second bottom portions 365 and 366 of the optical lens 301A may include an inclined surface 366A on the outer side of the top surface, and an outer sides of the first and second bottom portions 361 and 363 may be fitted into a fixing structure by the inclined surface 366A.

The protrusion structures 368 and 368A disposed at the lower portion of the optical lens of FIGS. 27 and 28 and the columnar structures 369 and 369A disposed at the lower portion of FIG. 29 may be disposed in a region which is not overlapped with the first exit surface 370 of the optical lens in a vertical direction. The protrusion structures 368 and 368A disposed at the lower portion of the optical lens of FIGS. 27 and 28 or the columnar structures 369 and 369A disposed at the lower portion of FIG. 29 are disposed so as to overlap with the first and second total reflective surfaces 362 and 364 in the vertical direction. The protrusion structures 368 and 368A disposed at the lower portion of the optical lens in FIGS. 27 and 28 or the columnar structures 369 and 369A disposed at the lower portion of FIG. 29 are perpendicular to the regions of the second and third exit surfaces 372 and 374 so that the optical lens may be supported and fixed.

The light emitting device according to the third embodiment may selectively include the light emitting devices shown in FIGS. 7 to 12, and the description of the embodiment(s) disclosed above will be referred to.

Fourth Embodiment

Figure 30:
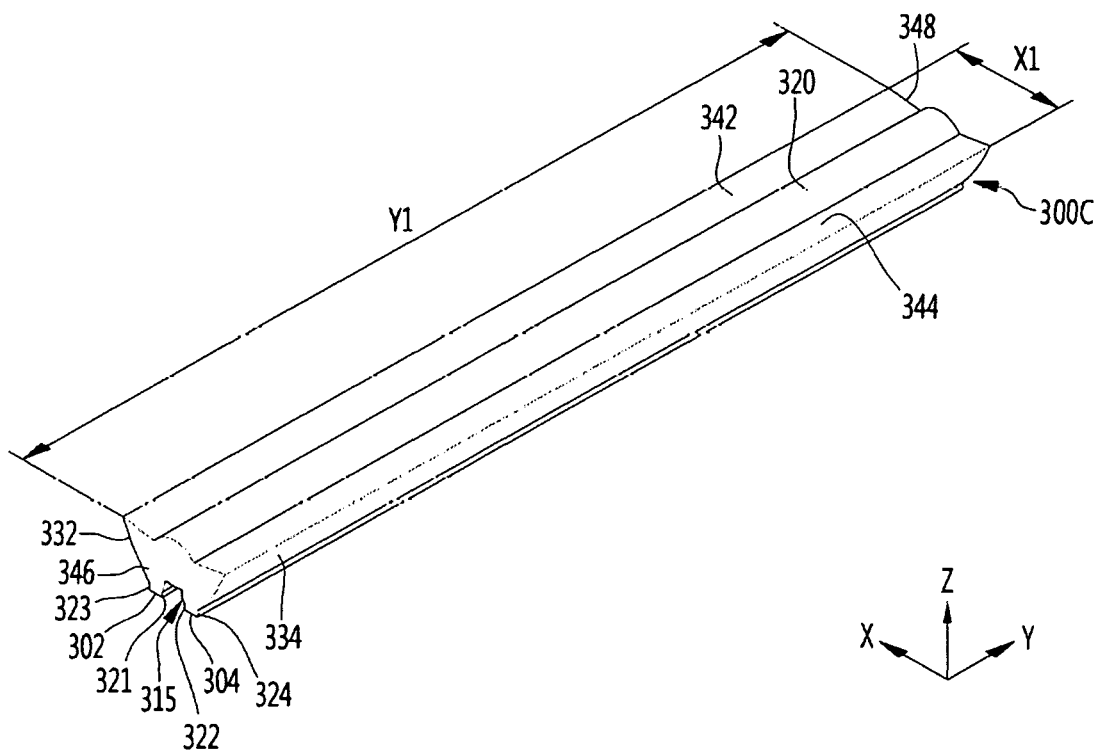
FIG. 30 is a perspective view showing the optical lens according to the fourth embodiment.
Figure 31:
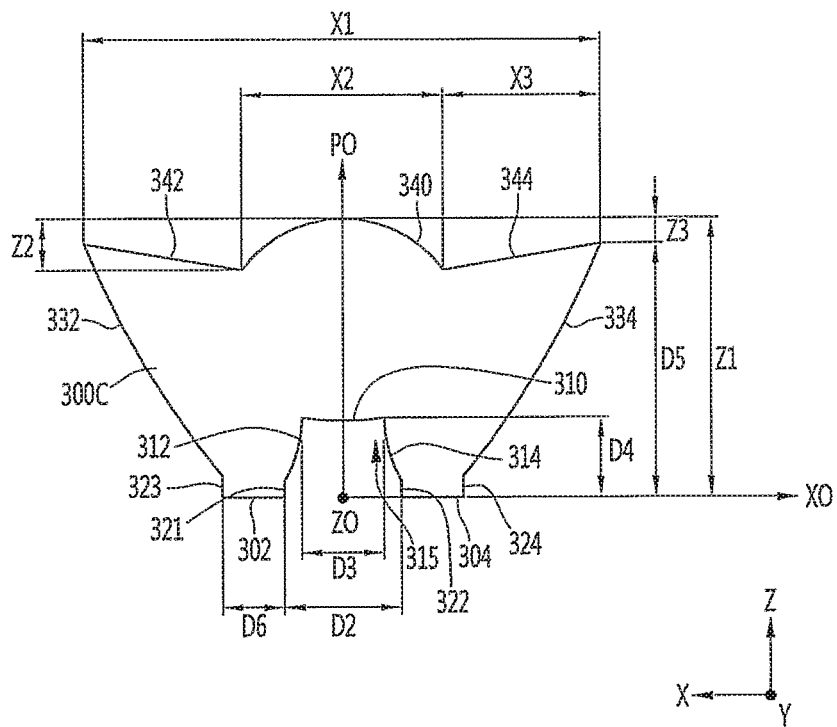
FIG. 31 is a side cross-sectional view taken along the optical lens of FIG. 30.
Figure 32:
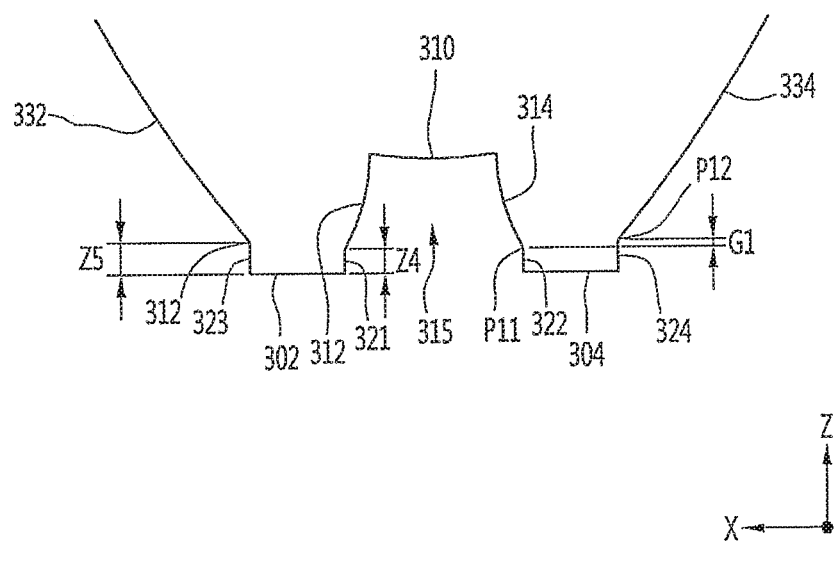
FIG. 32 is an enlarged view for explaining the first to fourth surfaces around the recess in the optical lens of FIG. 30.
Figure 33:
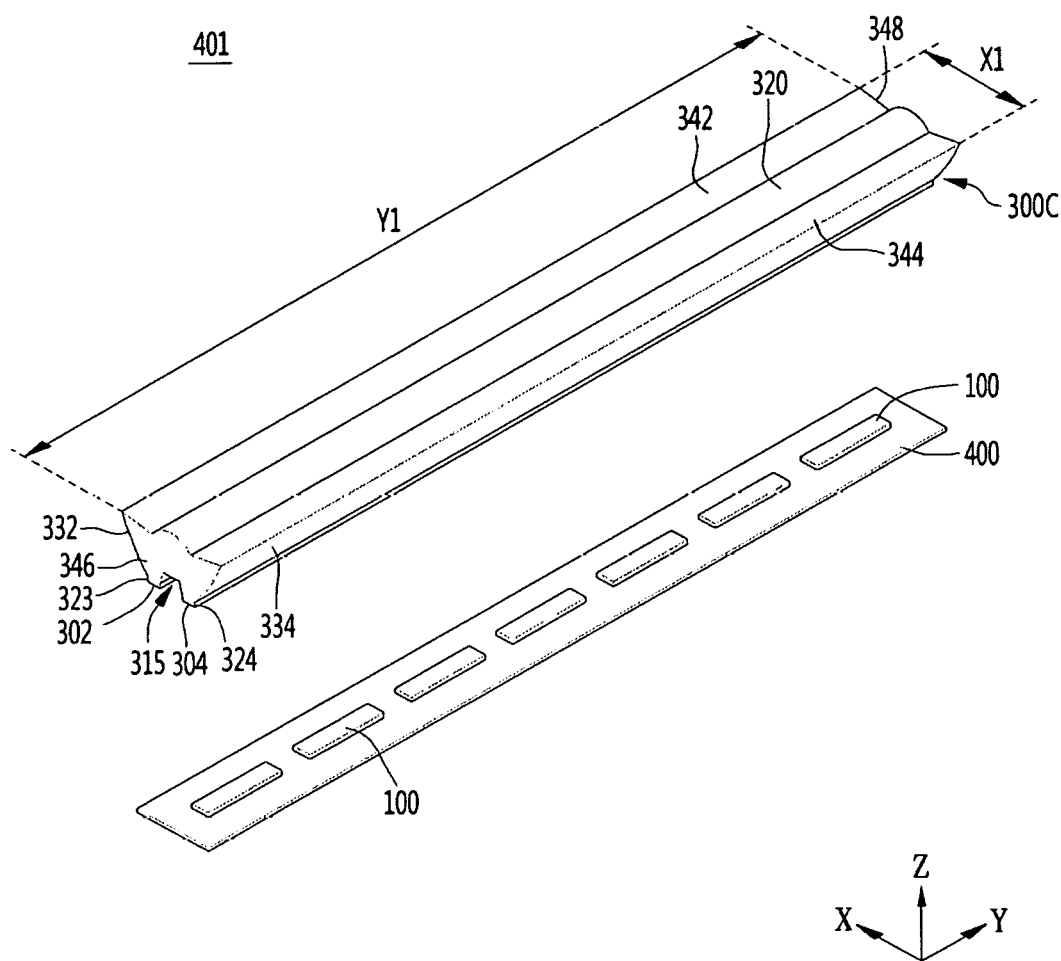
FIG. 33 is a perspective view showing a light unit having the optical lens of FIG. 30.

FIG. 30 is a perspective view showing the optical lens according to the fourth embodiment, FIG. 31 is a side sectional view of the optical lens of FIG. 30, FIG. 32 is an enlarged view for explaining the periphery of the recess of the optical lens of FIG. 31, and FIG. 33 is a perspective view showing a light unit having an optical lens shown in FIG. 30.

Referring to FIGS. 30 to 33, the optical lens 300C according to the fourth embodiment is a transparent body and may have a long length in one direction. The optical lens 300C may have a greater length Y1 in the second axis Y direction than a width X1 in the first axis X direction. The length Y1 of the optical lens 300C may be arranged three times or more, for example, in a range of four times or more, or in a range of four times to six times the width X1. If the length Y1 of the optical lens 300C exceeds the above range, the optical lens 300C may be bent. If the length is smaller than the above range, a number of the optical lens 300C mounted on the lighting device may have a may be increased. The X-axis direction may be a width direction of the optical lens 300C, and the Y-axis direction may be a length direction of the optical lens 300C. The length Y1 of the optical lens 300C may range from 60 mm or more, for example, in a range of 65 mm to 75 mm.

The thickness Z1 of the optical lens 300C according to the embodiment may be less than the width X1 of the optical lens 300C, for example, 1/2.5 or less of the width X1 of the optical lens 300C, for example, in a range of 1/2.5 to 1/1.8 of the width X1 of the optical lens 300C. If the thickness Z1 of the optical lens 300C is smaller than the above range, the light extraction efficiency may be lowered. If the thickness Z1 is greater than the above range, the light efficiency may be lowered. The optical lens 300C according to the embodiment may reduce the number of lenses and may improve the luminance of the lighting light and the light uniformity.

Referring to FIGS. 31 and 32, the optical lens 300C includes a plurality of bottom surfaces 302 and 304 disposed in the Y-axis direction along the body, a concavely recessed recess 315 between the plurality of bottom surfaces 302 and 304, an incident surfaces 310, 312 and 314 on the recess 315, a total reflective surfaces 332 and 334 on both sides of the body, and the exit surfaces 340, 342 and 344 on the incident surfaces 340 and 344 and the total reflective surfaces 332 and 334.

The plurality of bottom surfaces 302 and 304 in the optical lens 300C are bottom surfaces of the body and include first and second bottom surfaces 302 and 304. The first and second bottom surfaces 302 and 304 are disposed on a both sides of the recess 315. Here, the recess 315 may be recessed in a light emitting direction between the first and second bottom surfaces 302 and 304.

The first bottom surface 302 may be disposed to overlap the first exit surface 340 and the second exit surface 342 in the Z-axis direction to support a part of the bottom surface of the optical lens 300C. The first bottom surface 302 may not overlap with the first total reflective surface 332 in the Z-axis direction or may be disposed further inside than the first total reflective surface 332.

The second bottom surface 304 may be disposed to overlap the first exit surface 340 and the fourth exit surface 344 in a vertical direction to support a part of the bottom surface of the optical lens 300C. The second bottom surface 304 may not be overlapped with the second total reflective surface 334 in the Z axis direction or may be disposed further inside than the second total reflective surface 334.

The first and second bottom surfaces 302 and 304 may be disposed long in the Y-axis direction and may be disposed parallel to each other at the bottom center ZO of the recess 315. The width X3 of each of the first and second bottom surfaces 302 and 304 in the X-axis direction may be 2 mm or less, for example, in a range of 1.5 mm to 2 mm. The width X3 may be ¼ or less of Y1, or ½ or less of X1. The width X3 of the first and second bottom surfaces 302 and 304 is a width on the horizontal axis X0 with respect to the bottom center ZO of the recess 315. If the width is narrower than the above range, the strength may be lowed, if the width is greater than the above range, there is a problem that the width X1 of the optical lens 300C becomes too large.

The first and second bottom surfaces 302 and 304 may be flat surfaces and may be an uneven surface or may protrude a support protrusions (351 and 353 in FIG. 35) as will be described later.

The recess 315 may be disposed long in the Y-axis direction, i.e., the length direction. The length of the recess 315 may be equal to the length Y1 of the optical lens 300C. The length of the recess 315 may be smaller than the length Y1 of the optical lens 300C. In this case, another incident surface or another reflecting surface may be disposed outside the optical lens 300C in the length direction. The recess 315 may have a structure in which a bottom direction (or downward direction) and a Y-axis direction of the optical lens 300C are open.

The recess 315 may be disposed at a predetermined depth D4 from the bottom center ZO and a predetermined width. The recess 315 may have a gradually narrower width adjacent to the first incident surface 310. The recess 315 may have an upper width D3 that is narrower than the bottom width D2. The recess 315 may have a shape in which the width in the X-axis direction gradually decreases as the depth D4 in the Z-axis direction becomes deeper, and the difference between the upper width D3 and the bottom width D2 is 0.8 mm or more, for example, in a range of 0.8 mm to 1.2 mm. If the difference between the upper width D3 of the recess 315 and the bottom width D2 is greater or smaller than the above range, the light incident distribution may be changed. The bottom width D2 of the recess 315 may be 3 mm or more, for example, in a range of 3 mm to 4 mm, and the upper width D3 of the recess 315 may be in the range of 2 mm to 2.8 mm. The bottom width D2 of the recess 315 may be wider than the width of the light emitting device described later. The upper width D3 of the recess 315 may be wider than the width of the light emitting device described later. Since the recess 315 is arranged long in the length direction, a plurality of light emitting devices may be disposed inside the recess 315, thereby maximizing the light incidence efficiency.

The incident surfaces 310, 312, and 314 are disposed on the recess 315 arranged in the Y axis direction, and may be disposed on the upper surface and both sides of the recess 315. The incident surfaces 310, 312 and 314 include a first incident surface 310 disposed on the recess 315 and second and third incident surfaces 312 and 314 disposed on both sides of the recess 315. The first incident surface 310 may be a convex curved surface, for example, may include a convex curved surface toward the bottom of the recess 315. The first incident surface 310 may include a curved surface having a predetermined radius of curvature. Since the first incident surface 310 is provided as a curved surface convex downward, the incident light may be refracted to advance to the first exit surface 340.

The second incident surface 312 may be disposed between the first incident surface 310 and the first bottom surface 302, and the third incident surface 314 may be disposed between the first incident surface 310 and the second bottom surface 304. The second incident surface 312 may be a convex surface in the direction of the recess 315. The third incident surface 314 may be a curved surface convex toward the recess 315. Since the second and third incident surfaces 312 and 314 are disposed in a convex curved surface, the incident light may be refracted to advance to the first and second total reflective surfaces 332 and 334.

The exit surfaces 340, 342, and 344 disposed on the body are disposed along the Y-axis direction and may include at least three exit surfaces on the body. The exit surfaces 340, 342 and 344 include a convex first exit surface 340 in the body center region and second and third exit surfaces 342 and 344 on both sides of the first exit surface 340. The second exit surface 342 is disposed between the first exit surface 340 and the first total reflective surface 332 and the third exit surface 344 may be disposed between the first exit surface 340 and the second total reflective surfaces 334.

The first exit surface 340 refracts incident light to the first incident surface 310 and emits the light. The first exit surface 310 may be overlapped with the first incident surface 310, the second and third incident surfaces 312 and 314 in the vertical direction. The second exit surface 342 refracts the light incident through the second incident surface 312 and emits the light. The second exit surface 342 may be overlapped with the first total reflective surface 332 and the first bottom surface 302 in the Z-axis direction. The third exit surface 344 may refract light emitted through the third incident surface 314 and emits the light. The third exit surface 344 may be overlapped with the second total reflective surface 334 and the second bottom surface 304 in the Z-axis direction. The second and third exit surfaces 342 and 344 may be a plane and may be horizontal or inclined surface. As another example, the second and third exit surfaces 342 and 344 may be curved surfaces.

The total reflective surfaces 332 and 334 disposed on both side surfaces of the body have a long length in the Y-axis direction of the optical lens 300C and are disposed on both sides in the X-axis direction to change the path of the incident light from the side direction to the emission direction. The total reflective surfaces 332 and 334 include first and second total reflective surfaces 332 and 334, the first total reflective surface 332 is disposed between the first bottom surface 302 and the second exit surface, and the second total reflective surface 334 is disposed between the second bottom surface 304 and the third exit surface 344.

The first total reflective surface 332 has an outwardly convex curved surface and reflects the light incident on the second incidence surface 312 to the second exit surface 342. The second total reflective surface 334 has an outwardly convex curved surface and reflects the light incident on the third incident surface 314 to the third exit surface 344. Each of the first and second total reflective surfaces 332 and 334 may include curved surfaces having different radii of curvature.

Referring to FIG. 31, the first exit surface 340 of the optical lens 300C may be disposed in the center region and may include a convex surface in the direction of the central axis Y0. The first exit surface 340 may have a convex curved surface in a direction opposite to the protruding direction of the curved surface of the first incident surface 310. The first exit surface 340 may have a curved surface having a curvature radius smaller than the curvature radius of the first incident surface 310. The width X2 of the first exit surface 340 may be two times or more, for example, in a range of two times to three times the width D3 of the first incident surface 310. When the width X2 of the first exit surface 340 is smaller than the above range, the amount of light incident on the first exit surface 340 through the first incident surface 310 is reduced and there is a problem that a thickness Z1 of the optical lens 300C is reduced, when the width X2 of the first exit surface 340 is greater than the above range, the improvement of the exit efficiency is insignificant and may be different the width X3 of the second and third exit surfaces 342 and 344.

The width X2 of the first exit surface 340 may be greater than the width X3 of the second and third exit surfaces 342 and 344. The width X2 of the first exit surface 340 may be more than 1 times and 3 times or less the width X3 of the second and third exit surfaces 342 and 344. The ratio of the width X3 of the second or third exit surface to the width X2 of the first exit surface 340 may be in the range of 1:1.1 to 1:1.5. The width X2 of the first exit surface 340 may be 5 mm or more, for example, in a range of 5.5 mm to 6.5 mm and the width X3 of the second and third exit surfaces 342 and 344 may be 5.4 mm or less, for example, in a range of 4 mm to 5.4 mm. If the width X2 of the first exit surface 340 is smaller than the above range, the center emission efficiency may be lowered. If the width X2 is greater than the above range, the side emission efficiency may be lowered.

The first to third exit surfaces 340, 342, and 344 may have the same length as the length Y1 of the optical lens 300C. Since the first to third exit surfaces 340, 342 and 344 are arranged to have the same length as the recess 315, the first to third exit surfaces 340, 342 and 344 may refract the light incident through the first to incident surfaces 310, 312, and 314, and emit the light. As another example, the first exit surface 340 may have a length equal to the length Y1 of the optical lens 300C, and the second and third exit surfaces 342 and 344 may have a length equal to the length Y1 of the optical lens 300C and the second and third exit surfaces 342 and 344 may have a length shorter than the length Y1 of the optical lens 300C. This is because the region adjacent to the first and second total reflective surfaces 332 and 334 among the both sidewalls 346 and 348 of the optical lens 300C may be arranged as an inclined surface. Both sidewalls 346 and 348 of the optical lens 300C may be formed in a vertical plane or an inclined surface in a region adjacent to the first and second exit surfaces 342 and 344.

Figure 35:
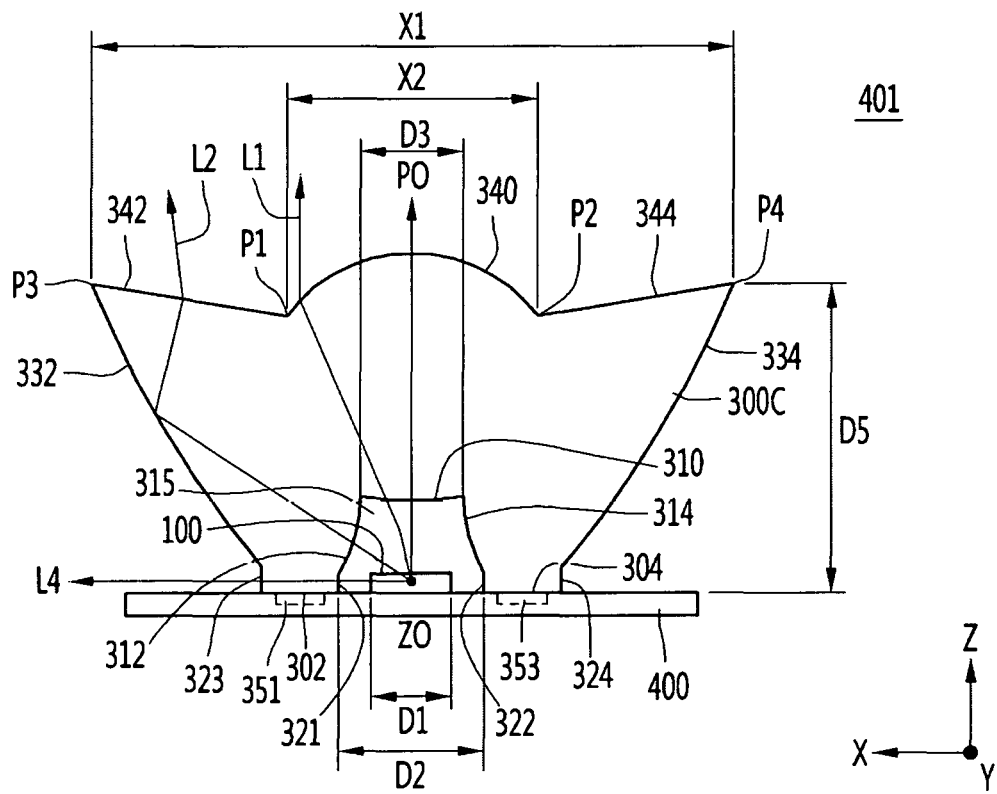
FIG. 35 is a side sectional view of the light unit of FIGS. 33 and 34.

As shown in FIGS. 31 and 35, the first exit surface 340 may have a gradually higher height toward the center from the boundary point (P1 and P2 in FIG. 35) with the first exit surface 340 and the second and third exit surfaces 342 and 344, and the maximum height Z2 may have a height of 1 mm or more, for example, in a range of 1.2 mm to 2 mm. The maximum height Z2 of the first exit surface 340 may vary depending on the radius of curvature or the width X2 of the first exit surface 340. Since the first exit surface 340 has the height Z2 and the width X2 and is disposed on the first incident surface 310, the light incident through the first incident surface 310 is refracted.

The maximum height or thickness D5 of the second and third exit surfaces 342 and 344 may be smaller than the thickness Z1 of the optical lens 300C. An outer points e.g. an outer edges (P3 and P4 in FIG. 35) of the second and third exit surfaces 340 may be lower than the peak height of the first exit surface 340. Since the second and third exit surfaces 340 provide inclined surfaces, the light reflected through the first and second total reflective surfaces 332 and 334 may be refracted. As another example, the height D5 of the second and third exit surfaces 342 and 344 may be greater than the height of the first exit surface 340, for example, may be greater than Z1. In this case, the beam angle distribution may become narrower.

The body of the optical lens 300C may include a light transmissive material. The optical lens 300C may include at least one of polycarbonate (PC), polymethyl methacrylate (PMMA), silicon or epoxy resin, or glass. The optical lens 300C may have a refractive index of 2 or less, and may include, for example, a transparent material in a range of 1.4 to 1.7. The optical lens 300C may have a bar shape, and the bar shape may have a straight line shape in the Y-axis direction as shown in FIG. 30. As another example, the optical lens may be a curved bar shape or a hemispherical bar shape, but is not limited thereto.

The first and second incident surfaces 312 and 314, the first and second total reflective surfaces 332 and 334, and the second and third exit surfaces 342 and 344 may be symmetrical or asymmetrical shape with respect to a straight line extending perpendicularly to the bottom center Z0 of the recess 315. The left/right symmetrical shape may have a uniform distribution of the light incident on and the light emitted by the left/right symmetrical shape, and the light distribution in any one direction may be increased by the asymmetric shape.

Referring to FIG. 35, the optical lens 300C may include a light emitting device 100 disposed on at least a portion of the recess 315, and an incident light L1 through the first incident surface 310 of the light emitted from the light emitting device 100 is refracted and emitted through the first exit surface 340. The light L2 incident through the second incident surface 312 and reflected by the first total reflective surface 332 is emitted through the second exit surface 312, the light L3 incident through the third incident surface 314 and reflected on the second reflective surface 334 is emitted through the third exit surface 344. In the optical lens 300C, the first, second, and third exit surfaces 340, 342, and 344 may emit parallel light when the light incident through each of the incident surfaces 310, 312 and 314 is emitted. The first and second total reflective surfaces 332 and 334 are outwardly convex curved surfaces and may function as reflective surfaces.

Referring to FIGS. 31 and 32, the optical lens 300C may be suppressed the light refracted by the first and second total reflective surfaces 332 and 334 according to a tilt and light incident on the second and third incident surfaces 312 and 314 from proceeding to a region of the other exit surface. To this end, an interference light blocking portion may be provided around the lower portion of the recess 315. The interference light blocking portion include first and second surfaces 321 and 322 between the bottom surfaces 302 and 304 and the second and third incident surfaces 312 and 314, and third and fourth surface 323 and 324 between the bottom surfaces 302 and 304 and the first and second total reflective surfaces 332 and 334.

The first surface 321 is disposed between the first bottom surface 302 and the second incident surface 312 and the second surface 322 is disposed between the second bottom surface 304 and the third incident surface 314. The first and second surfaces 321 and 322 may be planes on Y-Z plane, and may be parallel to each other. The first and second surfaces 321 and 322 may refract incident light onto the third and fourth surfaces 323 and 324 or the first and second bottom surfaces 302 and 304. An interval between the first and second surfaces 321 and 322 may be constant along the Y-axis direction.

The third surface 323 is disposed between the first bottom surface 302 and the first total reflective surface 332 and the fourth surface 324 is disposed between the second bottom surface 304 and the second total reflective surface 334. The third and fourth surfaces 323 and 324 may be flat on the Y-Z plane, and may be parallel to each other. The third and fourth surfaces 323 and 324 may emit light incident onto the first and second surfaces 321 and 322 to the outside in the X-axis direction. The third and fourth surfaces 323 and 324 may be disposed at positions where the light incident onto the first and second surfaces 321 and 322 may be prevented from being incident on the first and second total reflective surfaces 332 and 334. Each of the first and second surfaces 321 and 322 may be an incident surface and each of the third and fourth surfaces 323 and 324 may be an exit surface. In this case, the optical lens 300C may have at least three different incidence surfaces, for example, at least five different incidence surfaces. The optical lens 300C may disposed at least three exit surfaces on an emission region and at least two exit surfaces adjacent to the bottom surfaces 302 and 304.

Referring to FIG. 32, the height Z4 of the first and second surfaces 321 and 322 may be lower than the height Z5 of the third and fourth surfaces 323 and 324. A height Z5>Z4 of the third and fourth surfaces 323 and 324 may be disposed higher so that the light incident on the first and second surfaces 321 and 322 may be incident on the third and fourth surfaces 323 and 324 instead of the first and second total reflective surfaces 332 and 334. When the light incident on the first and second surfaces 321 and 322 is incident on the first and second total reflective surfaces 332 and 334, the light reflected by the first and second total reflective surfaces 332 and 334 travels to the first exit surface 340 and may be emitted as interference light, not parallel light, and it is difficult to control the light distribution.

The height Z5 of the third and fourth surfaces 323 and 324 may be disposed higher than the height Z4 of the first and second surfaces 321 and 322 by a difference G1 of 30 μm or more, in a range of 40 μm to 60 μm. When the height Z5 of the third and fourth surfaces 323 and 324 is lower than the above difference, a blocking of the interference light may be insignificant on the first and second total reflective surfaces 332 and 334, when it is greater than the above range, an area of the first and second total reflective surfaces 332 and 334 may be reduced. The height Z5 of the third and fourth surfaces 323 and 324 may be 1.05 or more times, for example, in the range of 1.1 to 1.2 times the height Z4 of the first and second surfaces 321 and 322. The height Z4 of the first and second surfaces 321 and 322 may be a height from the first and second bottom surfaces 302 and 304 to the boundary point P11 with the second and third incident surfaces 312 and 314. The height Z5 of the four surfaces 323 and 324 may be a height from the first and second bottom surfaces 302 and 304 to the boundary point P12 with the first and second total reflective surfaces 332 and 334. The height Z4 of the first and second surfaces 321 and 322 may be greater than a thickness of the light emitting device 100 or a height of the upper surface of the light emitting device 100 shown in FIG. 35. The height Z5 of the third and fourth surfaces 323 and 324 may be greater than the thickness of the light emitting device 100 or a height of the upper surface of the light emitting device 100. If the height Z4 of the first and second surfaces 321 and 322 is lower than the upper surface of the light emitting device 100, the interference light may not be removed. The height Z4 of the first and second surfaces 321 and 322 may be 400 µm or less, for example, in the range of 300±20 µm, based on the first and second bottom surfaces 302 and 304.

Figure 36:
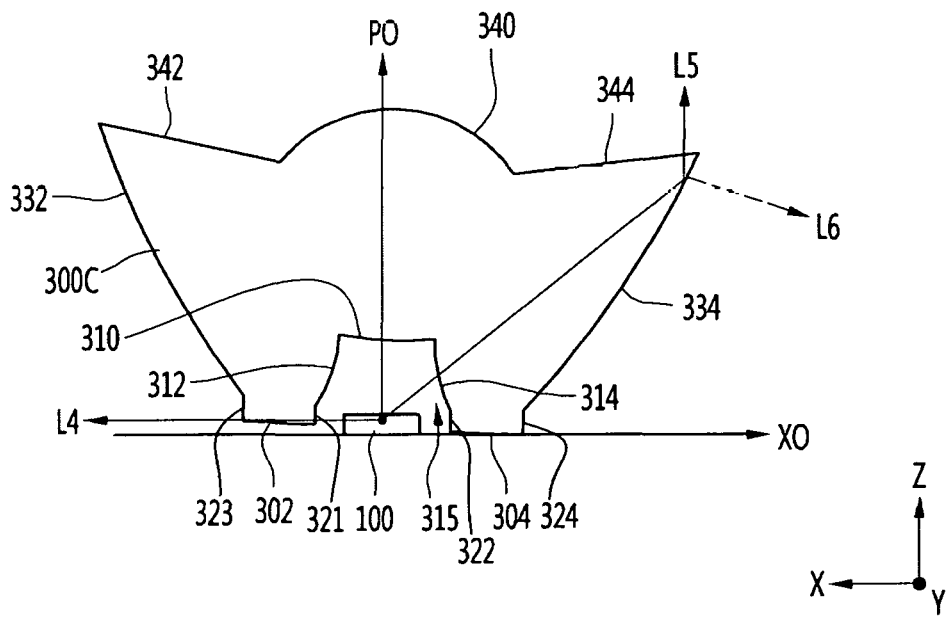
FIG. 36 is a view for explaining a problem according to the tilt in the optical lens of FIG. 31.

The optical lens 300C may be adhered onto the circuit board 400 of FIG. 33 with an adhesive member (not shown). The optical lens 300C may be adhered to the circuit board 400 with an adhesive member using the support protrusions 351 and 353 shown in FIG. 34. Such an optical lens 300C may cause a tilt problem in which the adhesive member is tilted in a predetermined direction when the adhesive member is adhered. For example, when the optical lens 300C is tilted at a predetermined angle, for example, about 5 degrees, as shown in FIG. 36, light emitted through the light emitting device 100 without the first and second surfaces 321 and 322 may be incident through the second and third incident 312 and 314. At this time, there is problem that light is reflected by the first and second total reflective surfaces 332 and 334 and then refracted through the first exit surface 340 and is emitted as interference light. In the embodiment, the light L4 emitted in a side direction through the light emitting device 100 is transmitted onto the third and fourth surfaces 323 and 324 through the first and second surfaces 321 and 322 even though the optical lens is tilted with respect to a horizontal straight line, so that it does not affect other exit surfaces. The light emitted through the third and fourth surfaces 323 and 324 may disappear in the bezel region of the display device. The light incident through the third incident surface 314 may be not reflected by the light path L6 that is leaked laterally through the second total reflective surface 334 but may have a light path L5 is totally reflected and emitted through an edge region of the third exit surface 344.

The first and second surfaces 321 and 322 may be symmetrical with respect to a straight line P0 perpendicular to the bottom center Z0 of the recess 315. The third and fourth surfaces 323 and 324 may be symmetrical with respect to a straight line P0 perpendicular to the bottom center ZO of the recess 315. Accordingly, even if the left/right position of the optical lens 300C is changed in the X-axis direction, the light interference may be blocked even if the optical lens is tilted leftward or rightward.

Figure 37:
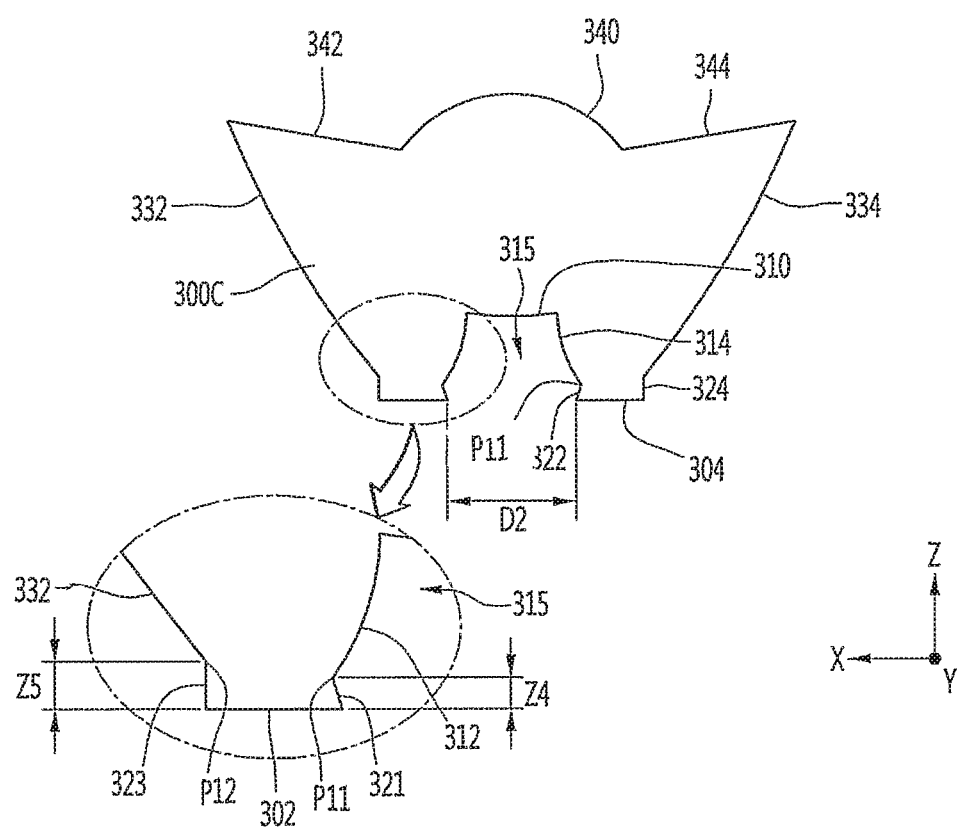
FIG. 37 is a first modification of the optical lens of FIG. 31.

The first and second surfaces 321 and 322 may be inclined as shown in FIG. 37. The inclined surface may have an angle of less than 90 degrees with respect to the first and second bottom surfaces 302 and 304. The inclined first and second surfaces 321 and 322 may transfer the incident light to the first and second bottom surfaces 302 and 304 or may be extracted the incident light through the third and fourth surfaces 323 and 324. The interval between the first and second surfaces 321 and 322 may gradually increase toward the first incident surface 310. As another example, the third and fourth surfaces 323 and 324 may be sloped surfaces or concave surfaces, the sloped surfaces may be less than 90 degrees with respect to the first and second bottom surfaces 302 and 304, and the concave surfaces is recessed in the direction of the first and second surfaces 321 and 322. These inclined third and fourth surfaces 323 and 324 may be treated with a surface that does not reflect the incident light.

Figure 38:
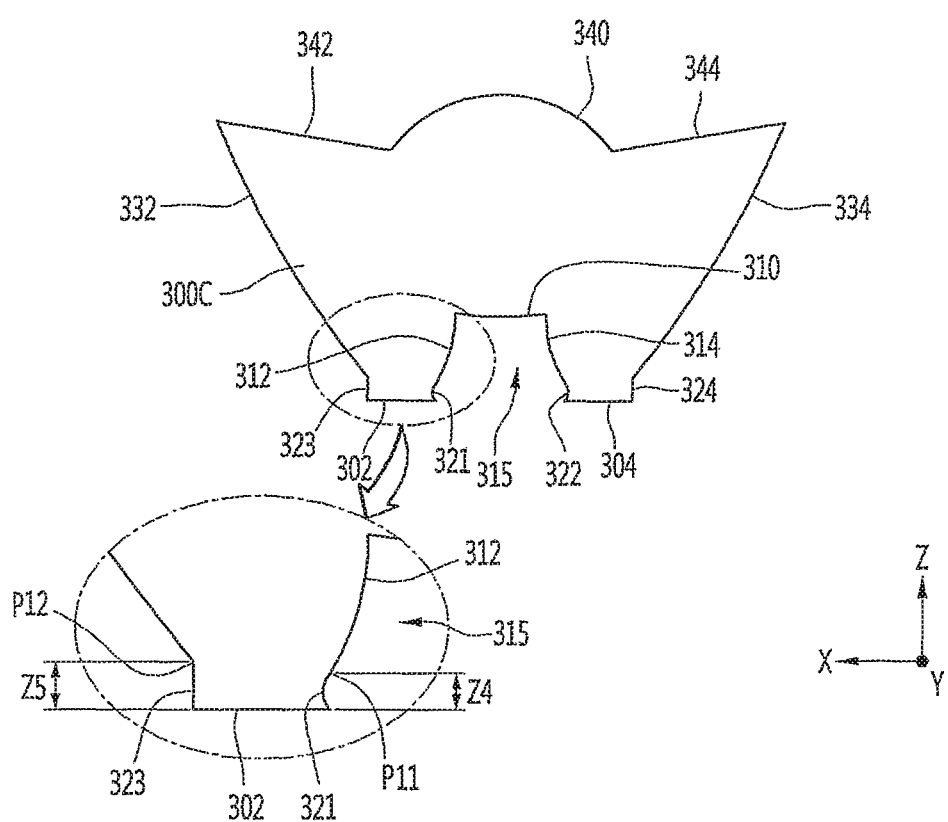
FIG. 38 is a second modification of the optical lens of FIG. 31.

The first and second surfaces 321 and 322 may be curved surfaces as shown in FIG. 38. The curved surface may be a recessed surface and the concave surface may be extracted the incident light through the first and second bottom surfaces 302 and 304 or the third and fourth surfaces 323 and 324. The concave surface may be an inflection point at a boundary between the second and third incident surfaces 312 and 314. The interval between the first and second surfaces 321 and 322 may gradually increase toward the first incident surface 310. Alternatively, the third and fourth surfaces 323 and 324 may be inclined surfaces or concave surfaces, and the inclined surfaces may be less than 90 degrees with respect to the first and second bottom surfaces, and the concave surfaces may be recessed in the direction of the surfaces 321 and 322. These inclined third and fourth surfaces 323 and 324 may be treated with a surface that does not reflect the incident light.

Referring to FIG. 33, in the light unit 401 according to the embodiment, the circuit board 400 and the light emitting device 100 may be disposed under the optical lens 300C. The light emitting module may include the light emitting device 100 and the circuit board 400. The light unit 401 may include the optical lens 300C, the circuit board 400, and the light emitting device 100.

The circuit board 400 may be disposed long in the Y-axis direction. The length of the circuit board 400 in the Y-axis direction may be wider than the length in the X-axis direction. The length of the circuit board 400 in the Y-axis direction may be equal to or greater than the length of the optical lens 300C in the Y-axis direction.

A plurality of the light emitting devices 100 may be disposed on the circuit board 400 in the direction of the length Y1 of the optical lens 300C. The plurality of light emitting devices 100 may be disposed along the optical lens 300C at predetermined intervals. At least a portion of the light emitting device 100 may be disposed within the recess 315 of the optical lens 300C. The light emitting device 100 may face the first and second surfaces 321 and 322 of the optical lens 300C.

The circuit board 400 may connect the plurality of light emitting devices 100 to each other, for example, in series, in parallel, or in series-parallel. The circuit board 400 may include a layer disposed under the optical lens 300C and absorbing or reflecting the light leaked from the optical lens 300C.

Figure 34:
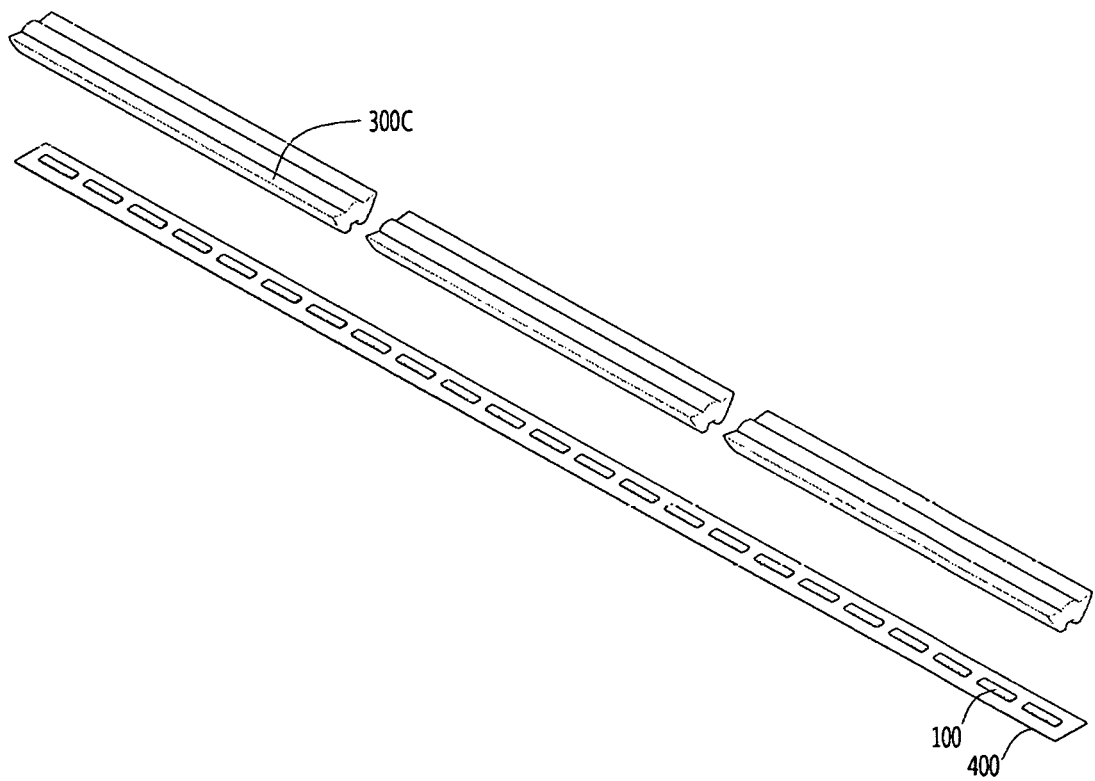
FIG. 34 is a perspective view showing another example of the light unit having the optical lens of FIG. 30.

Referring to FIG. 35, the width of the circuit board 400 in the X-axis direction may be wider than the bottom width D2 of the recess 315, and may be 5 mm or more. The circuit board 400 may be contacted with or spaced from the first and second bottom surfaces 302 and 304 of the optical lens 300C. The length of the circuit board 400 in the Y-axis direction is longer than the length (Y1 in FIG. 30) of the optical lens 300C so that light leaked from the optical lens 300C may be absorbed or reflected. One or a plurality of optical lenses 300C may be disposed on the circuit board 400. For example, as shown in FIG. 34, a plurality of optical lenses 300C may be disposed on a single circuit board 400 in the length direction. Since there is a problem that the length of the optical lens 300C (Y1 in FIG. 30) may be bent when molded to 80 mm or more, the plurality of optical lenses 300C may be disposed on one circuit board 400.

The circuit board 400 may include at least one of a resin-made PCB, a metal core PCB (MCPCB) having a metal core, and a flexible PCB (FPCB), but the invention is not limited thereto. The light emitting device 100 may emit at least one or more than two of white, blue, green, red, yellow, and ultraviolet light, but the invention is not limited thereto.

The light emitting device 100 may be disposed in the recess 315 of the optical lens 300C. The light emitting device 100 may be disposed adjacent to the first incident surface 310, the second and third incident surfaces 312 and 314 of the recess 315. The lower surface of the light emitting device 100 may be disposed at a higher than the bottom surfaces 302 and 304 of the optical lens 300C. The lower surface of the light emitting device 100 may be disposed above the circuit board 400. The lower surface of the light emitting device 100 may be disposed at higher than the upper surface of the circuit board 400. When the light emitting device 100 according to the embodiment emits light of at least three or more surfaces, the light emitted from the light emitting device 100 may be incident through the first incident surface 310, and second and third incident surfaces 312 and 314 of the optical lens 300C. Accordingly, a loss due to light emitted from the light emitting device 100 may be reduced.

The first exit surface 340 of the optical lens 300C emits the first light L1 incident on the first incident surface 310 within a range of 0 degrees±45 degrees with respect to the center axis Y0. The first exit surface 340 may refract the first light L1 such that the first light L1 does not deviate from a region of the first exit surface 340.

The second and third exit surfaces 342 and 344 of the optical lens 300C are emitted in a range of an angle of +45 degrees to +90 degrees and −45 degrees to −90 degrees. The second and third exit surfaces 342 and 344 may refract the emitted second light L2 so as not to deviate from a regions of the second and third exit surfaces 342 and 344.

The first and second surfaces 321 and 322 may emit incident light L4 through the third and fourth surfaces 323 and 324. When the light L4 travels to the exit surface, it may act as an interference light and leak through the third and fourth surfaces 323 and 324 to be extinguished.

The light emitting device according to the fourth embodiment may selectively include the light emitting devices shown in FIGS. 7 to 12, and the description of the embodiment(s) disclosed above will be referred to.

Lighting Device

The light unit 401 having the optical lenses 300, 301, 301A, and 300C according to the above-described embodiments may be applied to a display device, a three-dimensional display, various illumination lamps, a traffic light, a vehicle headlight, and an electric signboard.

Figure 39:
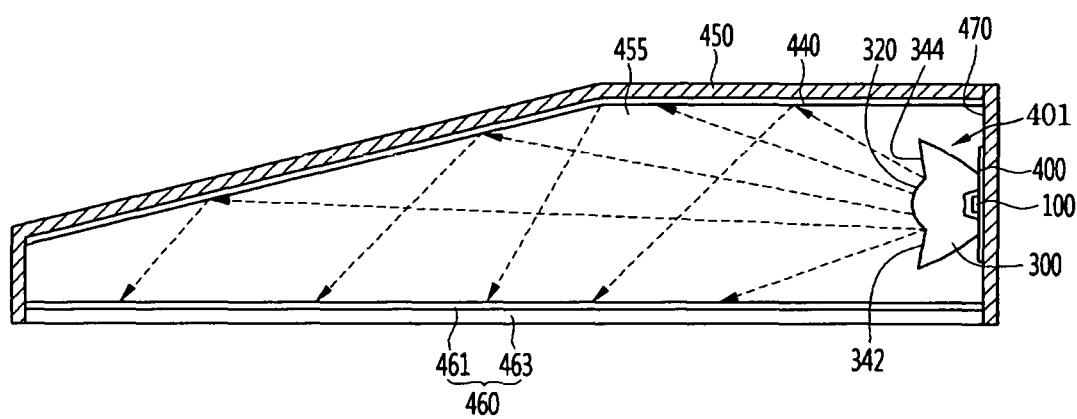
FIG. 39 is a view showing a lighting device having an optical lens according to an embodiment.

FIG. 39 is a view showing a lighting device having an optical lens and a light unit according to the embodiment.

Referring to FIG. 39, the lighting apparatus includes a housing 450 having a receiving space 455, a heat dissipation plate 470 disposed on one side of the housing 450, and a light unit 401 having an optical lens 300 according to the embodiment and disposed inside the heat dissipation plate 470, a reflective sheet 440 for reflecting light emitted through the optical lens 300, and an optical member 460 for diffusing the light emitted through the reflective sheet 440 and the optical lens 300 to the above. The optical lens 300 may selectively apply the optical lenses of the second, third, and fourth embodiments except for the first embodiment.

The housing 450 has the receiving space 455 therein to diffuse the light emitted from the light unit 401 to the entire region. The housing 450 may include at least one of a plastic material such as PC (Polycarbonate), PET (polyethylene terephthalate glycol), PE (polyethylene), PSP (polystyrene paper), polypropylene), and PVC (polyvinyl chloride). The housing 450 may be formed of a material having high light reflectivity, or a reflective layer may be further formed on the inner surface thereof. The housing 450 may be formed of a metal material, but the invention is not limited thereto.

The reflective sheet 440 may be disposed on a surface of the housing 450, for example, in a region for reflecting the light emitted from the optical lens 300 toward the optical member 460. The reflective sheet 440 may be disposed on the inner ceiling of the housing 450. The reflective sheet 440 may be formed of, for example, PET poly (ethylene terephthalate), PC (polycarbonate), or PVC poly (vinyl chloride) resin, but is not limited thereto.

The optical member 460 may include a diffusion sheet 461 and a protective sheet 463. The diffusion sheet 461 diffuses the light reflected from the optical lens 300 through the reflective sheet 440 so that the light is irradiated to the illumination area with a uniform light intensity. The protective sheet 463 may protect the surface of the illumination device.

The optical member 460 may include at least one of a diffusion material, for example, at least one of polymethylmethacrylate (PMMA), polypropylene (PP), polyethylene (PE), and polystyrene (PS). A plurality of optical sheets may be disposed in the optical member 180, but the invention is not limited thereto. A display panel may be further disposed outside the optical member 460, but the present invention is not limited thereto. The display panel may include a liquid crystal panel.

A light emitting chips 151 and 152 of the light emitting device disclosed in FIGS. 7 to 12 according to the embodiment may include, for example, a warm white LED and a cool white LED. Warm white light emitting diodes and cool white light emitting diodes emit white light. The warm white light emitting diodes and cool white light emitting diodes may emit white light of mixed light by radiating the correlated color temperature, so that the color rendering index (CRI) indicating the close proximity to natural sunlight is increased. Therefore, it is possible to prevent the color of the actual object from being distorted, thereby reducing the fatigue of the user's eyes.

Figure 40:
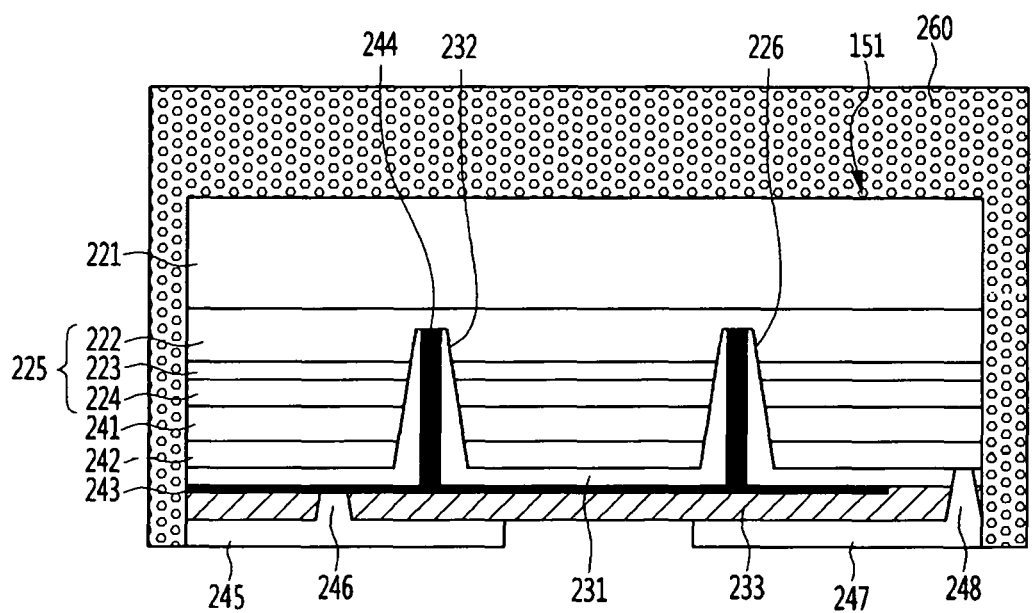
FIG. 40 is a side sectional view showing an example of a detailed configuration of a light emitting device according to the embodiment.

FIG. 40 is an example of a detailed configuration of the light emitting device according to the embodiment.

Referring to FIG. 40, the light emitting device 100 includes a light emitting chip 151 and a resin layer 260 on an outer side of the light emitting chip 151. The resin layer 260 may include a phosphor to change a wavelength of incident light. The light emitting device 100 is disposed in the recess 315 of the optical lens 300 according to the embodiment to emit light emitted from the light emitting chip 151. The light emitting device 100 will be described in detail with reference to the first light emitting chip 151 for convenience of description and the description of the second light emitting chip with reference to the description of the first light emitting chip 151.

The light emitting chip 151 includes a light emitting structure 225 and a plurality of pads 245 and 247. The light emitting structure 225 may be formed of a compound semiconductor layer of a group II to VI element, for example, a compound semiconductor layer of a group III-V element or a compound semiconductor layer of a group II-VI element. The plurality of pads 245 and 247 are selectively connected to the semiconductor layer of the light emitting structure 225 to supply power.

The light emitting structure 225 includes a first conductive type semiconductor layer 222, an active layer 223, and a second conductive type semiconductor layer 224. The light emitting chip 151 may include a substrate 221. The substrate 221 is disposed on the light emitting structure 225. The substrate 221 may be, for example, a light transmissive substrate, an insulating substrate, or a conductive substrate. The first conductive type semiconductor layer 222 may be an n-type semiconductor layer, and the second conductive type semiconductor layer 224 may be a p-type semiconductor layer. Alternatively, the first conductivity type semiconductor layer 222 may be a p-type semiconductor layer, and the second conductivity type semiconductor layer 224 may be an n-type semiconductor layer. The light emitting structure 225 may include at least one of an n-p junction, a p-n junction, an n-p-n junction, and a p-n-p junction. The light emitting chip 151 may include a device such as a Zener diode or a FET.

The light emitting chip 151 has pads 245 and 247 disposed thereunder and the pads 245 and 247 include first and second pads 245 and 247. The first and second pads 245 and 247 are spaced apart from each other under the light emitting chip 151. The first pad 245 is electrically connected to the first conductive type semiconductor layer 222 and the second pad 247 is electrically connected to the second conductive type semiconductor layer 224. The first and second pads 245 and 247 may have a polygonal or circular bottom shape or a shape corresponding to a pattern of the circuit board.

The light emitting chip 151 may include at least one of a buffer layer (not shown) and an undoped semiconductor layer (not shown) between the substrate 221 and the light emitting structure 225. The buffer layer is a layer for relaxing the difference in lattice constant between the substrate 221 and the semiconductor layer, and may be selectively formed from Group II to VI compound semiconductors. An undoped Group III-V compound semiconductor layer may be further formed under the buffer layer, but the present invention is not limited thereto. The substrate 221 may be removed. When the substrate 221 is removed, the phosphor layer 250 may contact the upper surface of the first conductive type semiconductor layer 222 or the upper surface of another semiconductor layer.

The light emitting chip 151 includes first and second electrode layers 241 and 242, a third electrode layer 243, and insulating layers 231 and 233. Each of the first and second electrode layers 241 and 242 may be formed as a single layer or a multilayer, and may function as a current diffusion layer. The first and second electrode layers 241 and 242 include a first electrode layer 241 disposed under the light emitting structure 225; and a second electrode layer 242 disposed under the first electrode layer 241. The first electrode layer 241 diffuses a current, and the second electrode layer 241 reflects incident light.

The first and second electrode layers 241 and 242 may be formed of different materials. The first electrode layer 241 may be formed of a light transmissive material, for example, a metal oxide or a metal nitride. The first electrode layer may include at least one of ITO (indium tin oxide), ITON (ITO nitride), IZO (indium zinc oxide), IZON (IZO nitride), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide). The second electrode layer 242 may contact the lower surface of the first electrode layer 241 and function as a reflective electrode layer. The second electrode layer 242 includes a metal such as Ag, Au, or Al. The second electrode layer 242 may partially contact the lower surface of the light emitting structure 225 when the first electrode layer 241 is partially removed.

As another example, the structures of the first and second electrode layers 241 and 242 may be stacked in an omnidirectional reflector layer (ODR) structure. The omnidirectional reflector structure may have a laminated structure of the first electrode layer 241 having a low refractive index and the second electrode layer 242 made of a highly reflective metal material in contact with the first electrode layer 241. The electrode layers 241 and 242 may have a laminated structure of, for example, ITO/Ag. The total reflection angle at the interface between the first electrode layer 241 and the second electrode layer 242 may be improved.

As another example, the second electrode layer 242 may be removed and formed of a reflective layer of another material. The reflective layer may be formed of a distributed Bragg reflector (DBR) structure. The distributed Bragg reflector structure includes a structure in which two dielectric layers having different refractive indices are alternately arranged, For example, may include any one of a $SiO_2$ layer, a $Si_3N_4$ layer, a $TiO_2$ layer, an $Al_2O_3$ layer, and an MgO layer, respectively. As another example, the electrode layers 241 and 242 may include both a distributed Bragg reflector structure and an omnidirectional reflector structure, and in this case, the light emitting chip 151 having a light reflectance of 98% or more may be provided. Since the light emitted from the second electrode layer 242 is emitted through the substrate 221, the light emitting chip 151 mounted on the flip-chip may emit most light in the vertical direction.

A third electrode layer 243 is disposed under the second electrode layer 242 and is electrically insulated from the first and second electrode layers 241 and 242. The third electrode layer 243 may be formed of a metal, for example, at least one of titanium (Ti), copper (Cu), nickel (Ni), gold (Au), chromium (Cr), tantalum (Ta), platinum (Pt), tin (Sn), Silver (Ag), and phosphorus (P). The first pad 245 and the second pad 247 are disposed under the third electrode layer 243. The insulating layers 231 and 233 prevent unnecessary contact between the first and second electrode layers 241 and 242, the third electrode layer 243, the first and second pads 245 and 247, and the light emitting structure 225. The insulating layers 231 and 233 include first and second insulating layers 231 and 233. The first insulating layer 231 is disposed between the third electrode layer 243 and the second electrode layer 242. The second insulating layer 233 is disposed between the third electrode layer 243 and the second half pads 245 and 247. The first and second pads 245 and 247 may include the same material as the first and second lead electrodes 415 and 417.

The third electrode layer 243 is connected to the first conductive type semiconductor layer 222. A connection portion 244 of the third electrode layer 243 protrudes in a via structure through the first and second electrode layers 241 and 242 and the lower portion of the light emitting structure 225 and contacts the first conductive type semiconductor layer 222. The connection portions 244 may be disposed in a plurality. A portion 232 of the first insulating layer 231 extends around the connection portion 244 of the third electrode layer 243 and blocks an electrical connection among the third electrode layer 243, the first and second electrode layers 241 and 242, and the second conductive type semiconductor layer 224 and the active layer 223. An insulating layer may be disposed on the side surface of the light emitting structure 225 for lateral protection, but the invention is not limited thereto.

The second pad 247 is disposed under the second insulating layer 233 and contacts or connects at least one of the first and second electrode layers 241 and 242 through an open region of the second insulating layer 233. The first pad 245 is disposed under the second insulating layer 233 and is connected to the third electrode layer 243 through an open region of the second insulating layer 233. The protrusion 248 of the first pad 247 is electrically connected to the second conductive type semiconductor layer 224 through the first and second electrode layers 241 and 242 and the protrusion 246 of the second pad 245 is electrically connected to the first conductive type semiconductor layer 222 through the third electrode layer 243.

The first and second pads 245 and 247 are spaced apart from each other at a lower portion of the light emitting chip 151 and face the pattern of the circuit board.

The first pad 245 and the second pad 247 of the light emitting chip 151 may be bonded to a circuit board with a bonding member. The bonding member may include a solder paste material. The solder paste material includes at least one of Au, Sn, Pb, Cu, Bi, In, and Ag. As another example, the bonding member may include a conductive film, and the conductive film includes at least one conductive particle in an insulating film. The conductive particles may include, for example, at least one of a metal, a metal alloy, and carbon. The conductive particles may include at least one of nickel, silver, gold, aluminum, chromium, copper, and carbon. The conductive film may include an anisotropic conductive film or an anisotropic conductive adhesive.

The light emitting chip 151 may emit light to a surface of the circuit board 400 and the side surfaces and the upper surface of the light emitting structure 225, thereby improving light extraction efficiency. Such a light emitting device has a plurality of light emitting chips and may be bonded on a circuit board in a flip chip manner, so that the process may be simplified. Further, since the heat dissipation of the light emitting device is improved, it may be usefully used in the field of illumination and the like.

The resin layer 260 may be disposed on the upper surface and the side surface of the light emitting chip 151 to change the wavelength of emitted light to prevent moisture penetration. Although the bottom side of the resin layer 260 is disposed outside the pads 245 and 247, any one of the electrode layers 241, 242, and 243 may be formed, but the invention is not limited thereto.

Figure 41:
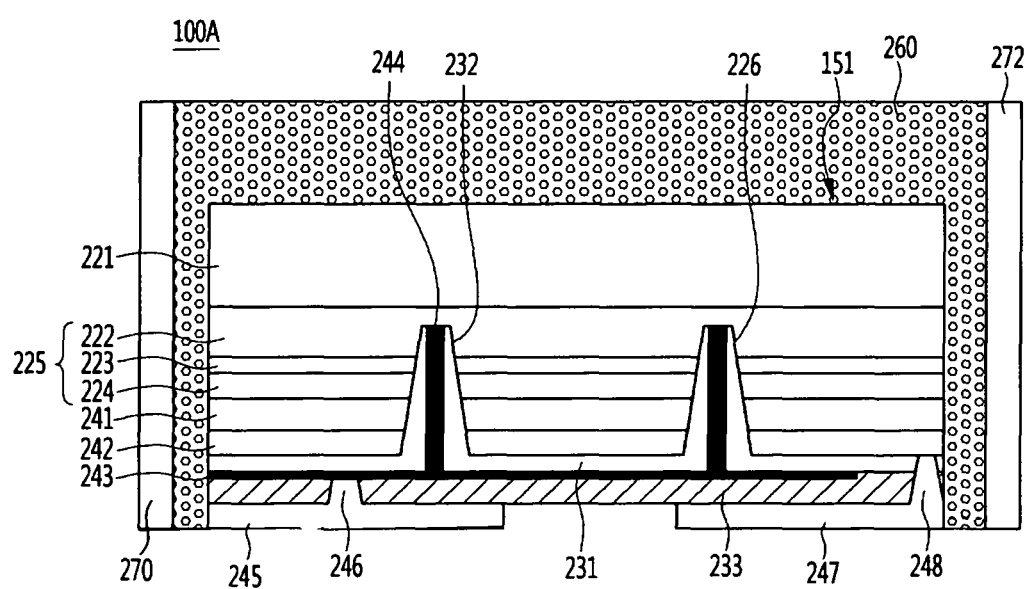
FIG. 41 is a side sectional view showing another example of the detailed structure of the light emitting device according to the embodiment.

FIG. 41 is another example of the detailed structure of the light emitting device of FIG. 40. In the description of FIG. 41, the same configuration as FIG. 40 is referred to the description of FIG. 40 and may be selectively applied.

Referring to FIG. 41, an outer wall of the light emitting device is disposed on reflective members 271 and 272, and the reflective member may be disposed on an outer surface of the resin layer 260. The resin layer 260 may be disposed between the reflective members 270 and 272 and the light emitting chip 151. The reflective members 270 and 272 may reflect incident light. The light emitting device of the embodiment is described as an example in which the reflecting member is disposed on two side surfaces of the resin layer 260, but it may be disposed on three or four side surfaces. Further, as shown in FIG. 5, the reflective member may be further disposed on the outermost side of the light emitting device disposed on the outermost one of the light emitting devices arranged on the circuit board, thereby preventing light leakage. In this light emitting device, light emitted to both sides of the light emitting chip 151 may be reflected by the reflecting member to the incident surface area of the optical lens.

The features, structures, effects and the like described in the embodiments are included in at least one embodiment of the invention, and are not necessarily limited to only one embodiment. Furthermore, the features, structures, effects and the like illustrated in the embodiments may be combined and modified by other persons skilled in the art to which the embodiments belong. Therefore, it is to be understood that the invention is not limited to these embodiments.

While the invention has been shown and described with reference to certain preferred embodiments thereof, it will be understood by those skilled in the art that various changes in form and details may be made therein without departing from the spirit and scope of the invention as defined by the appended claims. It may be seen that various modifications and applications are possible. For example, each component specifically shown in the embodiments may be modified and implemented. It is to be understood that the present invention may be embodied in many other specific forms without departing from the spirit or essential characteristics thereof.

INDUSTRIAL APPLICABILITY

The present invention may apply a long optical lens in one direction to various light units or lighting devices.

The present invention may use an optical lens having improved light uniformity and a light unit having the optical lens as a display device.

What is claimed is:

1. An optical lens comprising:
   first and second bottom surfaces spaced apart from each other and having a long length in a second axial direction perpendicular to a first axial direction at a lower portion of a transparent body;
   a concave recess between the first and second bottom surfaces;
   plurality of incident surfaces having a first incident surface on the recess, a second incident surface and a third incident surface corresponding to each other on both sides of the recess;
   a first total reflective surface and a second total reflective surface disposed on opposite sides of the body;
   a first exit surface having a long length in the second axial direction on the body and overlapping with the recess in a vertical direction;
   a second exit surface disposed between the first exit surface and the first total reflective surface;
   a third exit surface disposed between the first exit surface and the second total reflective surface,
   wherein the second incident surface is disposed between the first bottom surface and the first incident surface;
   a first surface between the second incident surface and the first bottom surface;
   a second surface between the third incident surface and the second bottom surface;
   a third surface between the first total reflective surface and the first bottom surface; and
   a fourth surface between the second total reflective surface and the second bottom surface,
   wherein the third incident surface is disposed between the second bottom surface and the first incident surface,
   wherein the second and third incident surfaces include a convex curved surface in a direction of the recess,
   wherein the first and second total reflective surfaces include a convex curved surface in an outward direction of the body,
   wherein the first total reflective surface is disposed between the first bottom surface and the second exit surface, and wherein the second total reflective surface is disposed between the second bottom surface and the third exit surface, wherein a length in the second axial direction of the optical lens is three times or more than a length in the first axial direction of the optical lens, wherein the second exit surface and the third exit surface are separated from each other, wherein the first surface and the second surface are spaced apart from each other, wherein each of the first to fourth surfaces has a long length along the second axial direction of the body, wherein each of the first to fourth surfaces has a longer length in the second axial direction than a length in the first axial direction, and wherein a first angle between straight lines connecting both edges of the first incident surface with respect to a bottom center of the recess is greater than a second angle between straight lines connecting both edges of the first exit surface.

2. The optical lens of claim 1, wherein the first incident surface includes a convex curved surface or a plane, and the second and third incident surfaces include a surface perpendicular to a lower portion of the convex curved surface thereof.

3. The optical lens of claim 1, wherein the first exit surface include a convex curved surface having a width wider than a width of the first incident surface, wherein the second and third exit surfaces are spaced apart from the first exit surface, and wherein a height of an outer edge of the second and third exit surfaces is disposed lower than a peak of the first exit surface.

4. The optical lens of claim 3, wherein the first bottom surface overlaps the first exit surface and the second exit surface in the vertical direction, wherein the first total reflective surface overlaps the second exit surface in the vertical direction, wherein the second bottom surface overlaps the first and third exit surfaces in the vertical direction, and wherein the second total reflective surface overlaps the third exit surface in the vertical direction.

5. The optical lens of claim 4, wherein the length of the body in the second axial direction is four times or more than the length in the first axial direction, and a thickness of the body is greater than the length of the body in the first axial direction.

6. The optical lens of claim 4, wherein a third angle between straight lines passing through an outer edge of the second and third exit surfaces with respect to the bottom center of the recess is greater than the first angle.

7. The optical lens of claim 3, wherein a height of the third and fourth surfaces is higher than a height of the first and second surfaces, and wherein the first and second surfaces face each other.

8. The optical lens of claim 7, wherein the third and fourth surfaces comprise a vertical plane, and wherein the first and second surfaces include at least one of a vertical plane, a concave curved surface, and a sloped surface.

9. The optical lens of claim 7, wherein the first surface extends from a first end at the first bottom surface to a second end at the second incident surface, the second surface extends from a third end at the second bottom surface to a fourth end at the third incident surface, and an interval between the second end of the first surface and the fourth end of the second surface is greater than an interval between the first end of the first surface and the third end of the second surface, and wherein the height of the third and fourth surfaces is in a range of 1.1 times to 1.2 times the height of the first and second surfaces.

10. A light unit comprises:

the optical lens of claim 4;

a plurality of light emitting devices disposed in the recess of the optical lens; and a circuit board under the light emitting device, wherein the optical lens comprises the first and second bottom surfaces spaced apart from each other and having a long length in the second axial direction perpendicular to the first axial direction at the lower portion of the transparent body, wherein the recess is disposed between the first and second bottom surfaces, wherein the optical lens comprises a support protrusions protruding from each of the first and second bottom surfaces toward the circuit board.

11. An optical lens comprising:

first and second bottom surfaces spaced apart from each other and having a long length in a second axial direction perpendicular to a first axial direction at a lower portion of a transparent body;

a concave recess between the first and second bottom surfaces;

plurality of incident surfaces having a first incident surface on the recess, a second incident surface and a third incident surface corresponding to each other on both sides of the recess;

a first exit surface having a long length in the second axial direction on the body and overlapping with the recess in a vertical direction;

second and third exit surfaces spaced apart from each other in the first axial direction and having a long length in the second axial direction;

a first total reflective surface between the second exit surface and the first bottom surface;

a second total reflective surface between the third exit surface and the second bottom surface, wherein the plurality of incident surfaces includes a first incident surface on the recess, a second incident surface between the first incident surface and the first bottom surface, and a third incident surface between the first incident surface and the second bottom surface;

a first surface between the second incident surface and the first bottom surface;

a second surface between the third incident surface and the second bottom surface;

a third surface between the first total reflective surface and the first bottom surface; and a fourth surface between the second total reflective surface and the second bottom surface, wherein the first incident surface includes a convex curved surface toward a bottom of the recess, wherein the first exit surface includes a convex curved surface, wherein the convex curved surface of the first exit surface includes a curvature radius smaller than a curvature radius of the curved surface of the first incident surface, wherein a length in the second axial direction of the optical lens is three times or more than a length in the first axial direction of the optical lens, wherein the second exit surface and the third exit surface are separated from each other, wherein the first surface and the second surface are spaced apart from each other, wherein each of the first to fourth surfaces has a long length along the second axial direction of the body, wherein each of the first to fourth surfaces has a longer length in the second axial direction than a length in the first axial direction, and wherein a first angle between straight lines connecting both edges of the first incident surface with respect to a bottom center of the recess is greater than a second angle between straight lines connecting both edges of the first exit surface.

12. The optical lens of claim 11, wherein the second and third incident surfaces include convex curved surfaces in a direction of the recess.

13. The optical lens of claim 11, wherein a lower width of the first exit surface is wider than a width of the first incident surface in the first axial direction, wherein the second and third exit surfaces include inclined surfaces having a gradually higher height toward an outside from the first exit surface, and wherein heights of an outer edges of the second and third exit surfaces are disposed lower than a peak of the first exit surface.

14. The optical lens of claim 13, wherein the first bottom surface overlaps the first exit surface and the second exit surface in the vertical direction, wherein the first total reflective surface overlaps with the second exit surface in the vertical direction, wherein the second bottom surface overlaps the first and third exit surfaces in the vertical direction, and wherein the second total reflective surface overlaps the third exit surface in the vertical direction.

15. The optical lens of claim 14, wherein the length of the body in the second axial direction is at least four times the length of the body in the first axial direction, and wherein a thickness of the body is greater than the length of the body in the first axial direction.

16. The optical lens of claim 11, wherein a third angle between straight lines passing through an outer edge of the second and third exit surfaces with respect to the bottom center of the recess is greater than the first angle.

17. The optical lens of claim 13, wherein the first surface extends from the second incident surface toward the first bottom surface, wherein the second surface extends from the third incident surface toward the second bottom surface, and wherein a heights of the third and fourth surfaces are higher than a heights of the first and second surfaces.

18. The optical lens of claim 17, wherein the third and fourth surfaces comprise a vertical plane, wherein the third surface vertically extends from the first total reflective surface toward the first bottom surface, wherein the fourth surface vertically extends from the second total reflective surface toward the second bottom surface, and wherein the first and second surfaces comprise one of a vertical surface, a concave curved surface, or a sloped surface.

19. The optical lens of claim 11, wherein the first surface extends from a first end at the first bottom surface to a second end at the second incident surface, the second surface extends from a third end at the second bottom surface to a fourth end at the third incident surface, and an interval between the second end of the first surface and the fourth end of the second surface is greater than an interval between the first end of the first surface and the third end of the second surface, wherein the third and fourth surfaces overlap the second and third incident surfaces in the first axis direction, and wherein the heights of the third and fourth surfaces have a range of 1.1 to 1.2 times the height of the first and second surfaces.

* * * * *